US008994726B1

(12) United States Patent
Furukawa et al.

(10) Patent No.: US 8,994,726 B1
(45) Date of Patent: Mar. 31, 2015

(54) SYSTEMS AND METHODS FOR PREPARING A MODEL OF AN ENVIRONMENT FOR DISPLAY

(75) Inventors: Yasutaka Furukawa, Bellevue, WA (US); Jianxiong Xiao, Cambridge, MA (US)

(73) Assignee: Google Inc., Mountain View, CA (US)

( * ) Notice: Subject to any disclaimer, the term of this patent is extended or adjusted under 35 U.S.C. 154(b) by 437 days.

(21) Appl. No.: 13/414,672

(22) Filed: Mar. 7, 2012

Related U.S. Application Data

(60) Provisional application No. 61/587,619, filed on Jan. 17, 2012, provisional application No. 61/581,875, filed on Dec. 30, 2011.

(51) Int. Cl.
*G06T 17/00* (2006.01)
*G06T 17/05* (2011.01)
*G06T 17/10* (2006.01)
*G06F 17/50* (2006.01)

(52) U.S. Cl.
CPC ............. *G06T 17/05* (2013.01); *G06F 17/5004* (2013.01); *G06T 17/10* (2013.01)
USPC ........................................................ 345/420

(58) Field of Classification Search
CPC ..... G06F 17/5004; G06T 17/10; G06T 17/00; G06T 2210/04
USPC .................................................. 345/419, 420
See application file for complete search history.

(56) References Cited

U.S. PATENT DOCUMENTS

| 6,137,492 | A | 10/2000 | Hoppe | |
|---|---|---|---|---|
| 6,456,288 | B1 * | 9/2002 | Brockway et al. | ............ 345/428 |
| 7,523,411 | B2 * | 4/2009 | Carlin | ............................ 715/782 |
| 2006/0061566 | A1 | 3/2006 | Verma et al. | |
| 2006/0152522 | A1 | 7/2006 | Strassenburg-Kleciak et al. | |
| 2009/0006480 | A1 * | 1/2009 | Fuchs et al. | ................. 707/104.1 |
| 2009/0216501 | A1 * | 8/2009 | Yeow et al. | ........................ 703/1 |
| 2011/0218777 | A1 | 9/2011 | Chen et al. | |

OTHER PUBLICATIONS

Koussa et al., A Simplified Geometric and Topological Modeling of 3D Buildings Enriched by Semantic Data: Combination of Surface-based and Solid-based Representations; GIS Ostrava 2009.*
Elmqvist et al., A Taxonomy of 3D Occlusion Management for Visualization; IEEE Transactions on Visualization and Computer Graphics, vol. 14 Issue 5, Sep. 2008.*
Knodel et al.; Interactive Generation and Modification of Cutaway Illustrations for Polygonal Models; SG'09 Proceedings of the 10th International Symposium on Smart Graphics; 2009.*

(Continued)

*Primary Examiner* — Carlos Perromat
(74) *Attorney, Agent, or Firm* — Lerner, David, Littenberg, Krumholz & Mentlik, LLP

(57) ABSTRACT

System and methods for preparing a model of an environment for display are provided. In some aspects, a system includes a transformation module configured to modify a three-dimensional (3D) model of an environment such that a target wall portion of the 3D model is more visible from a viewing direction after the modification than prior to the modification. The modification of the 3D model is based on constructive solid geometry and comprises at least one of i) a removal of at least one ceiling wall portion of the 3D model, ii) a thickening of at least one lateral wall portion of the 3D model, and iii) a removal of an obstructing wall portion. The obstructing wall portion blocks at least a partial view of the target wall portion from the viewing direction.

30 Claims, 22 Drawing Sheets

(56) References Cited

OTHER PUBLICATIONS

Furukawa et al., "Accurate and robust line segment extraction by analyzing distribution around peaks in Hough space", Computer Vision and Image Understanding, 2003, pp. 1-25, vol. 92.

Kazhdan et al., "Poisson Surface Reconstruction", Eurographics Symposium on Geometry Processing, 2006.

Li et al., "GlobFit: Consistently Fitting Primitives by Discovering Global Relations", ACM Transactions on Graphics (TOG)—Proceedings of ACM SIGGRAPH 2011, Jul. 2011, vol. 30, Issue 4.

Merrell et al., "Computer-Generated Residential Building Layouts", ACM Transactions on Graphics (TOG)—Proceedings of ACM SIGGRAPH Asia 2010, Dec. 2010, vol. 29, Issue 6.

Hough, "Machine Analysis of Bubble Chamber Pictures", International Conference on High-Energy Accelerators and Instrumentation—CERN 1959, Sep. 14-19, 1959, pp. 554-556.

Felzenszwalb et al., "Distance Transforms of Sampled Functions", Computing and Information Science Technical Reports, Sep. 1, 2004, pp. 1-15, retrieved from <http://hdl.handle.net/1813/5663>.

Furukawa et al., "Reconstructing Building Interiors from Images", 2009 IEEE 12th International Conference on Computer Vision, Sep. 29, 2009-Oct. 2, 2009, pp. 80-87.

Brenner et al. "Fast production of Virtual Reality City Models", IAPRS, vol. 32/4, ISPRS Commission IV Symposium on GIS—Between Visions and Applications, 1998.

Frédérique et al. "3D GIS as Applied to Cadastre—A Benchmark of Today's Capabilities", FIG Working Week 2011 Bridging the Gap between Cultures; May 2011.

Okorn et al.; Toward Automatic Modeling of Floor Plans; Proceedings of the Symposium on 30 Data Processing, Visualization and Transmission, May 2010.

Vosselman et al. "3D Building Model Reconstruction From Point Clouds and Ground Plans", International Archives of Phtogrammetry and Remote Sensing, vol. XXXIV-3/W4; Oct. 2001.

* cited by examiner

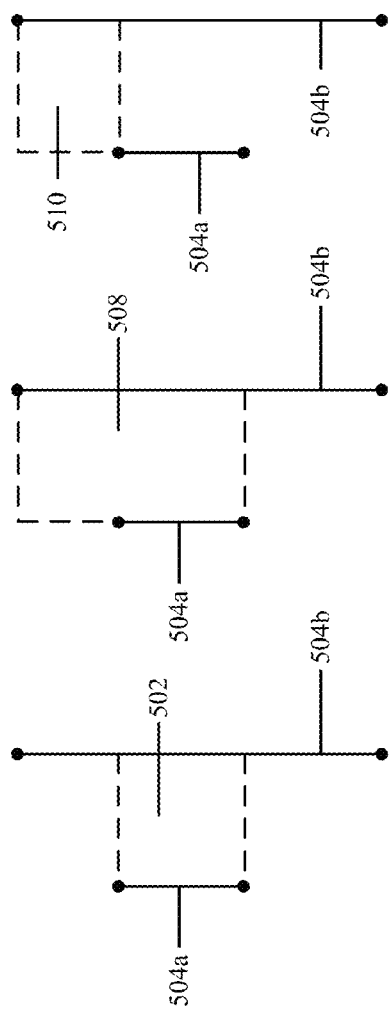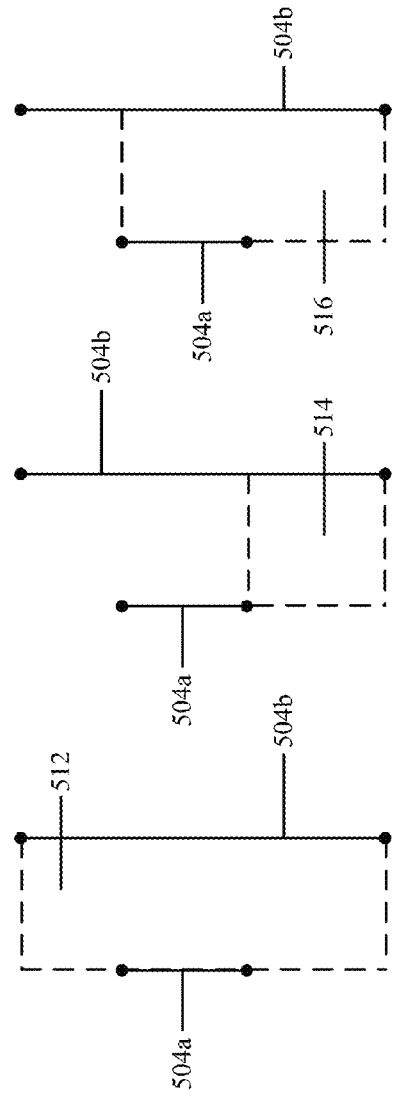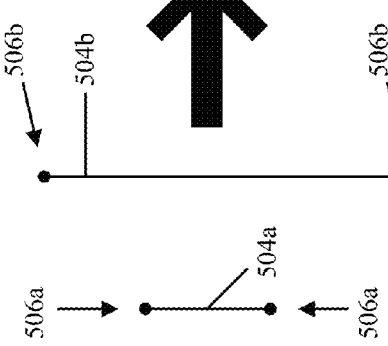

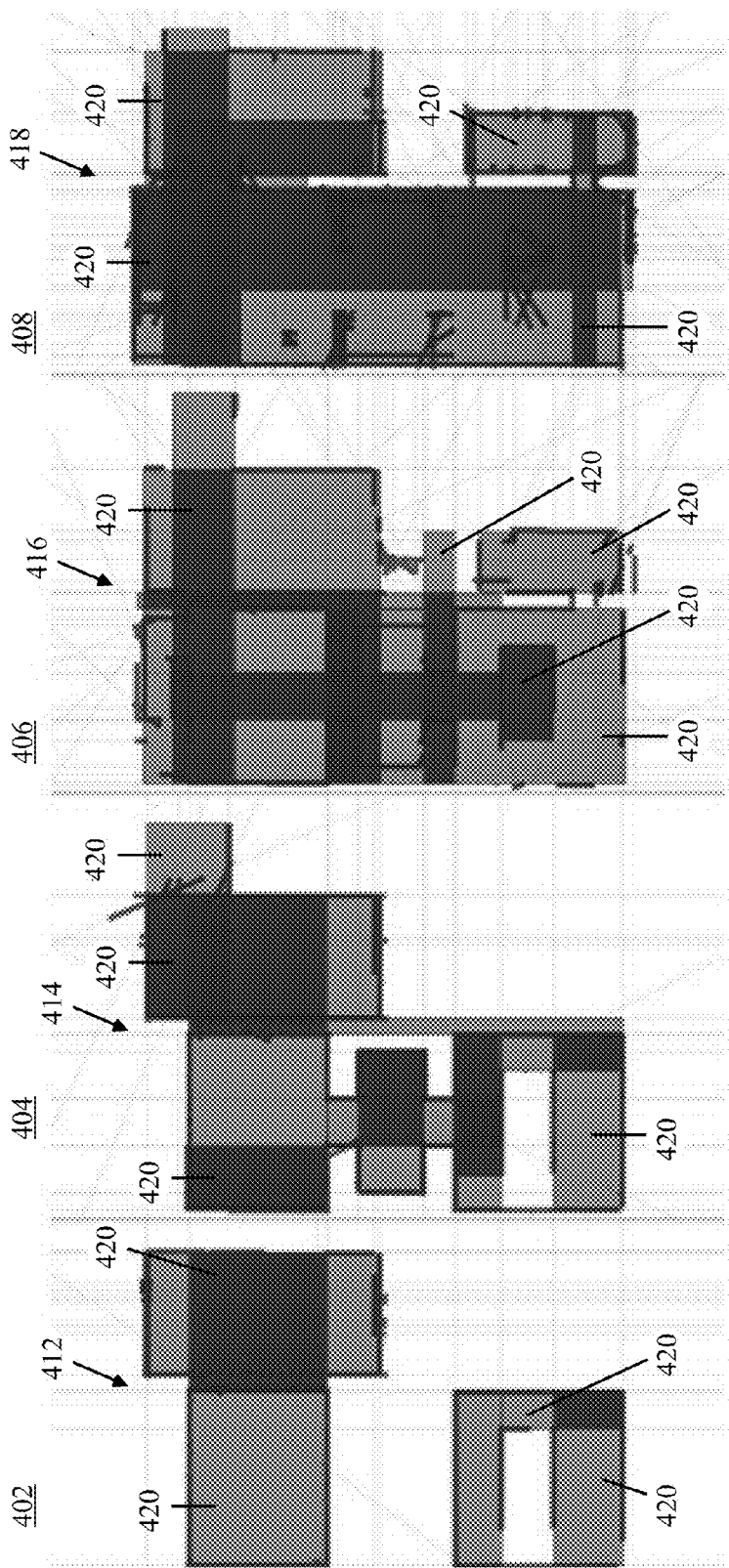

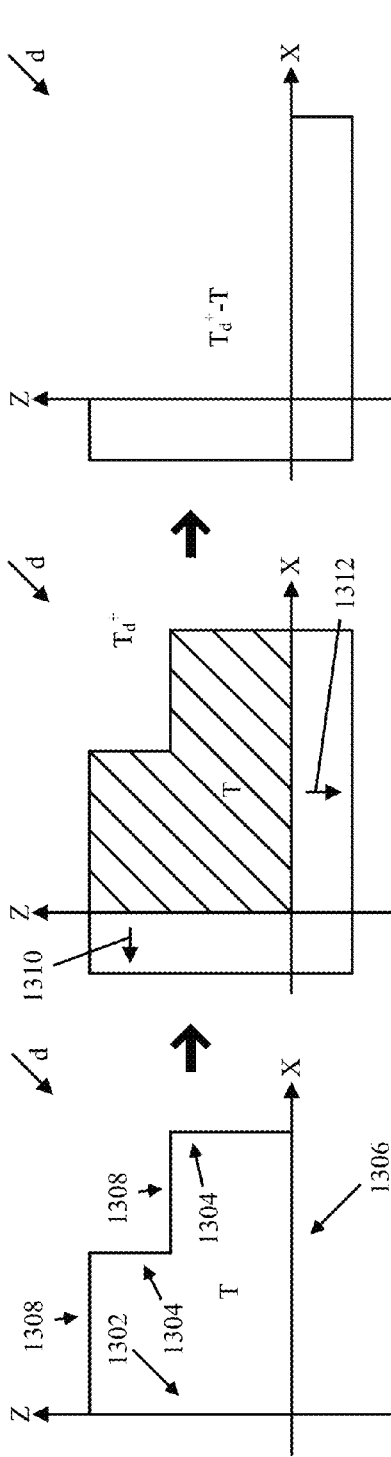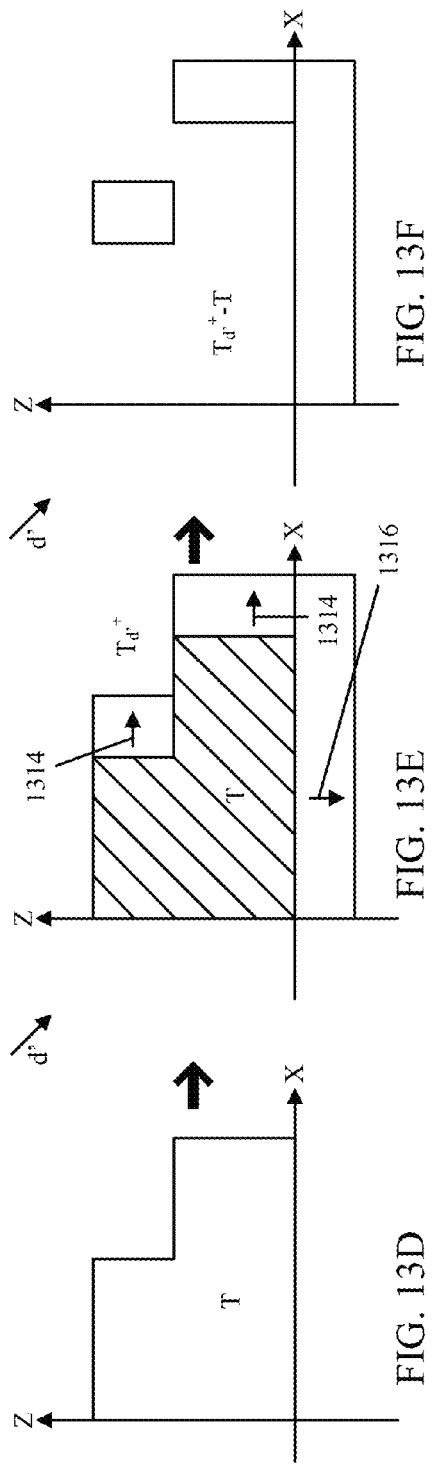

SYSTEMS AND METHODS FOR PREPARING A MODEL OF AN ENVIRONMENT FOR DISPLAY

CROSS-REFERENCES TO RELATED APPLICATIONS

The present application claims the benefit of U.S. Provisional Patent Application Ser. No. 61/581,875 (entitled "Systems and Methods for Generating a Model of an Environment" and filed on Dec. 30, 2011) and U.S. Provisional Patent Application Ser. No. 61/587,619 (entitled "Systems and Methods for Preparing a Model of an Environment for Display" and filed on Jan. 17, 2012), both of which are hereby incorporated by reference in their entirety for all purposes.

FIELD

The subject technology generally relates to graphics modeling and, in particular, relates to systems and methods for preparing a model of an environment for display.

BACKGROUND

A mapping application typically provides a user with an aerial view of a geographic area, which may contain one or more structures. While the mapping application may provide the user with useful information for navigating around the geographic area, the mapping application typically does not provide any useful information for navigating within the one or more structures. It is therefore desirable to provide models of indoor environments so that useful information for navigating around the indoor environments can be provided to the user as well.

SUMMARY

According to various aspects of the subject technology, a system for generating a model of an environment is provided. The system comprises a layer module configured to identify one or more layers of the environment based on a plurality of three-dimensional (3D) points mapping the environment. The system also comprises a layout module configured to generate a layout for each layer. Each layout comprises a two-dimensional (2D) model of the environment. The system also comprises a construction module configured to generate a 3D model of the environment based on the 2D model of each layout.

According to various aspects of the subject technology, a computer-implemented method for generating a model of an environment is provided. The method comprises identifying one or more layers of the environment based on a plurality of three-dimensional (3D) points mapping the environment. The method also comprises generating a layout for each layer. Each layout comprises a two-dimensional (2D) model of the environment. The method also comprises generating a 3D model of the environment based on the 2D model of each layout.

According to various aspects of the subject technology, a machine-readable medium encoded with executable instructions for generating a model of an environment is provided. The instructions comprising code for identifying one or more layers of the environment based on a plurality of three-dimensional (3D) points mapping the environment. The instructions also comprise code for generating a layout for each layer, code for projecting the plurality of 3D points onto corresponding ones of the one or more layouts, code for generating one or more line segments for each layout based on corresponding ones of the plurality of projected 3D points, code for generating one or more 2D primitives for each layout based on corresponding ones of the one or more line segments, code for selecting a 2D set of the one or more 2D primitives based on corresponding ones of the plurality of 3D points, code for generating a two-dimensional (2D) model of the environment for each layout based on a corresponding 2D set of the one or more 2D primitives, and code for generating a 3D model of the environment based on the 2D model of each layout.

According to various aspects of the subject technology, a system for preparing a model of an environment for display is provided. The system comprises a transformation module configured to modify a three-dimensional (3D) model of an environment such that a target wall portion of the 3D model is more visible from a viewing direction after the modification than prior to the modification. The modification of the 3D model is based on constructive solid geometry (CSG) and comprises at least one of i) a removal of at least one ceiling wall portion of the 3D model, ii) a thickening of at least one lateral wall portion of the 3D model, and iii) a removal of an obstructing wall portion. The at least one lateral wall portion comprises the obstructing wall portion. The obstructing wall portion blocks at least a partial view of the target wall portion from the viewing direction.

According to various aspects of the subject technology, a computer-implemented method for preparing a model of an environment for display is provided. The method comprises modifying a three-dimensional (3D) model of an environment such that a target wall portion of the 3D model is more visible from a viewing direction after the modification than prior to the modification. The modification of the 3D model is based on constructive solid geometry (CSG) and comprises at least one of i) a removal of at least one ceiling wall portion of the 3D model, ii) a thickening of at least one lateral wall portion of the 3D model, and iii) a removal of an obstructing wall portion. The at least one lateral wall portion comprises the obstructing wall portion. The obstructing wall portion blocks at least a partial view of the target wall portion from the viewing direction.

According to various aspects of the subject technology, a machine-readable medium encoded with executable instructions for preparing a model of an environment for display is provided. The instructions comprise code for modifying a three-dimensional (3D) model of an environment such that a target wall portion of the 3D model is more visible from a viewing direction after the modification than prior to the modification. The instructions also comprise code for selecting one or more images from a plurality of images of the environment and mapping the selected one or more images to the modified 3D model. The modification of the 3D model is based on constructive solid geometry (CSG) and comprises at least one of i) a removal of at least one ceiling wall portion of the 3D model, ii) a thickening of at least one lateral wall portion of the 3D model, and iii) a removal of an obstructing wall portion. The at least one lateral wall portion comprises the obstructing wall portion. The obstructing wall portion blocks at least a partial view of the target wall portion from the viewing direction.

Additional features and advantages of the subject technology will be set forth in the description below, and in part will be apparent from the description, or may be learned by practice of the subject technology. The advantages of the subject technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

FIGS. 5A, 5B, 5C, 5D, 5E, 5F, and 5G illustrate examples of generating 2D primitives based on line segments, in accordance with various aspects of the subject technology.

FIGS. 8A, 8B, 8C, and 8D illustrate 2D models comprising one or more selected 2D primitives, in accordance with various aspects of the subject technology.

FIGS. 13A, 13B, 13C, 13D, 13E, 13F, and 13G illustrate a side view of examples of a 3D model being modified, in accordance with various aspects of the subject technology.

DETAILED DESCRIPTION

In the following detailed description, numerous specific details are set forth to provide a full understanding of the subject technology. It will be apparent, however, to one ordinarily skilled in the art that the subject technology may be practiced without some of these specific details. In other instances, well-known structures and techniques have not been shown in detail so as not to obscure the subject technology.

A plurality of three-dimensional (3D) points (e.g., a 3D point cloud) may be used to map an environment (e.g., capture an outline of the environment). For example, a trolley comprising one or more laser scanners may traverse an indoor environment while the one or more laser scanners scan the indoor environment to collect laser 3D points that map the indoor environment. Using the position of the trolley, the time at which each 3D point was scanned, the angle at which each 3D point was scanned, and/or other suitable information, the position of each 3D point may be determined (e.g., elevation and/or horizontal coordinates that may be expressed as coordinates relative to an x-axis, a y-axis, and a z-axis). Thus, a plurality of 3D points may map an indoor environment. According to various aspects of the subject technology, a 3D model of the indoor environment may be generated using the plurality of 3D points. Although indoor environments are described, 3D models of other suitable environments, such as outdoor environments, may also be generated.

Figure 1:
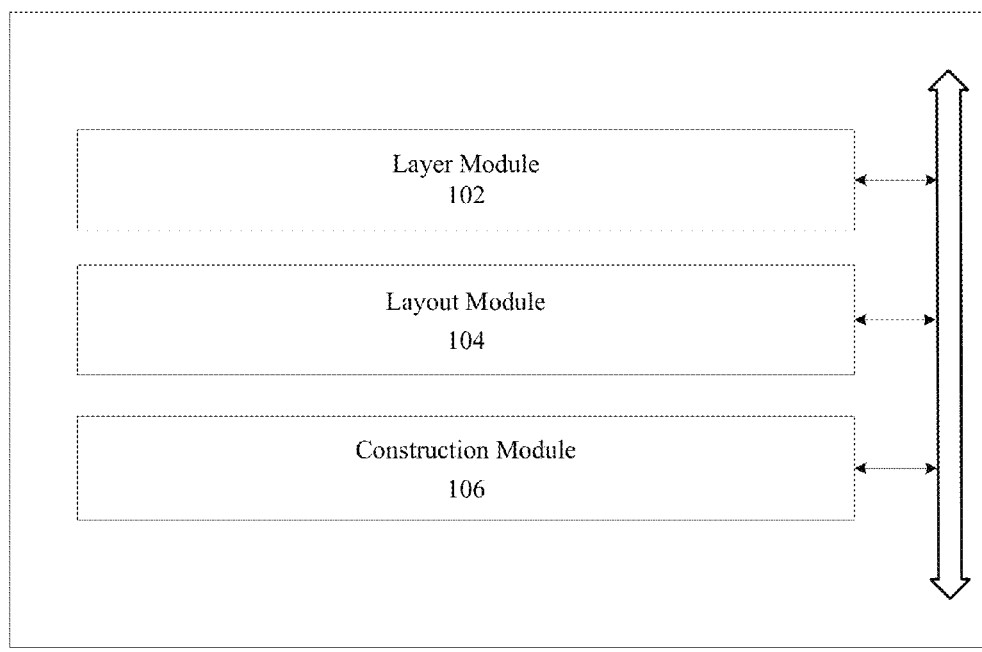
FIG. 1 illustrates an example of a system for generating a model of an environment, in accordance with various aspects of the subject technology.

FIG. 1 illustrates an example of system 100 for generating a model of an environment, in accordance with various aspects of the subject technology. System 100 comprises layer module 102, layout module 104, and construction module 106. These modules may be in communication with one another. In some aspects, the modules may be implemented in software (e.g., subroutines and code). In some aspects, some or all of the modules may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both. Additional features and functions of these modules according to various aspects of the subject technology are further described in the present disclosure.

Figure 2:
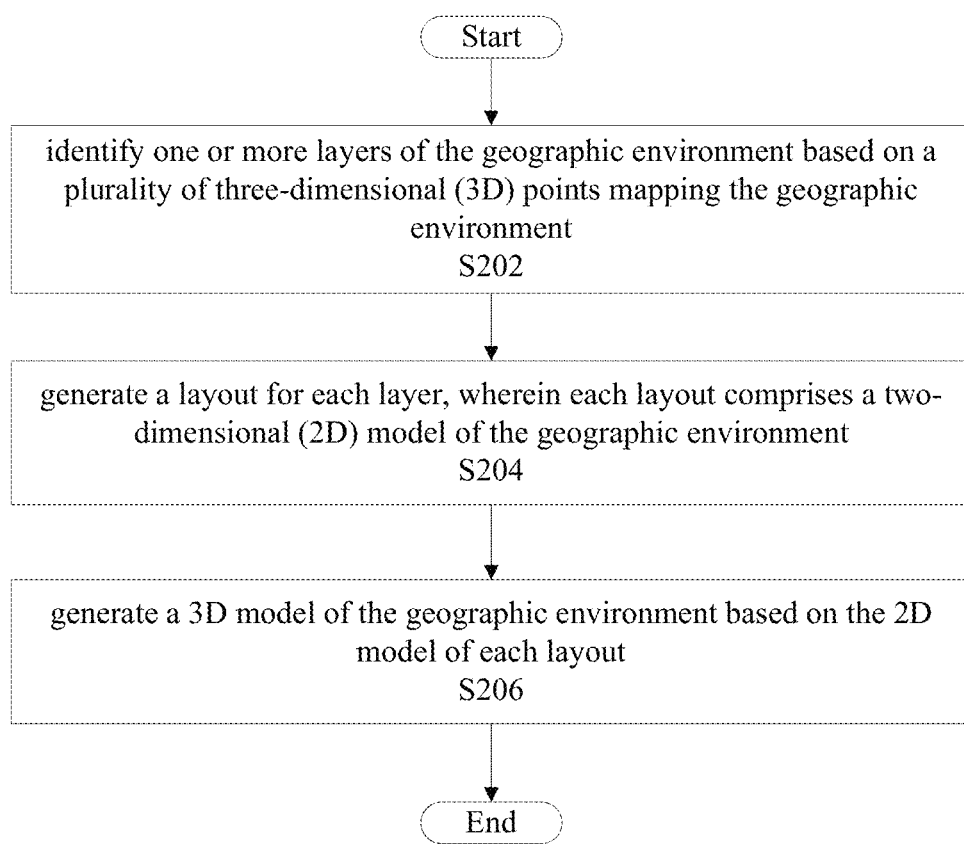
FIG. 2 illustrates an example of a method for generating a model of an environment, in accordance with various aspects of the subject technology.
Figure 3A:
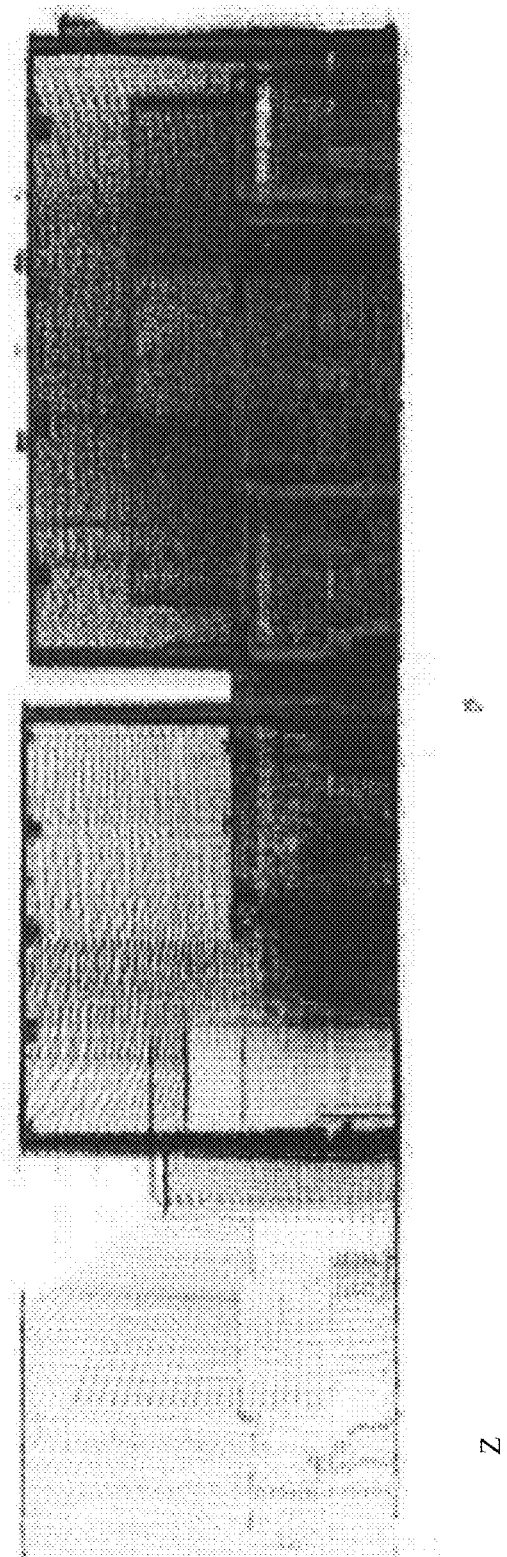
FIG. 3A illustrates an example of a plurality of 3D points mapping an environment, in accordance with various aspects of the subject technology.

FIG. 2 illustrates an example of method 200 for generating a model of an environment, in accordance with various aspects of the subject technology. Method 200, for example, may be implemented by system 100. However, method 200 may be implemented by other suitable systems having different configurations. FIG. 3A illustrates an example of a plurality of 3D points 300 mapping an environment, in accordance with various aspects of the subject technology. FIG. 3A illustrates a side view of the environment mapped by the plurality of 3D points 300. According to certain aspects, the 3D model of the environment may be generated by dividing the plurality of 3D points into different layers, generating a two-dimensional (2D) model of the environment for each layer, and generating the 3D model of the environment based on the 2D models of each layer.

Figure 3B:
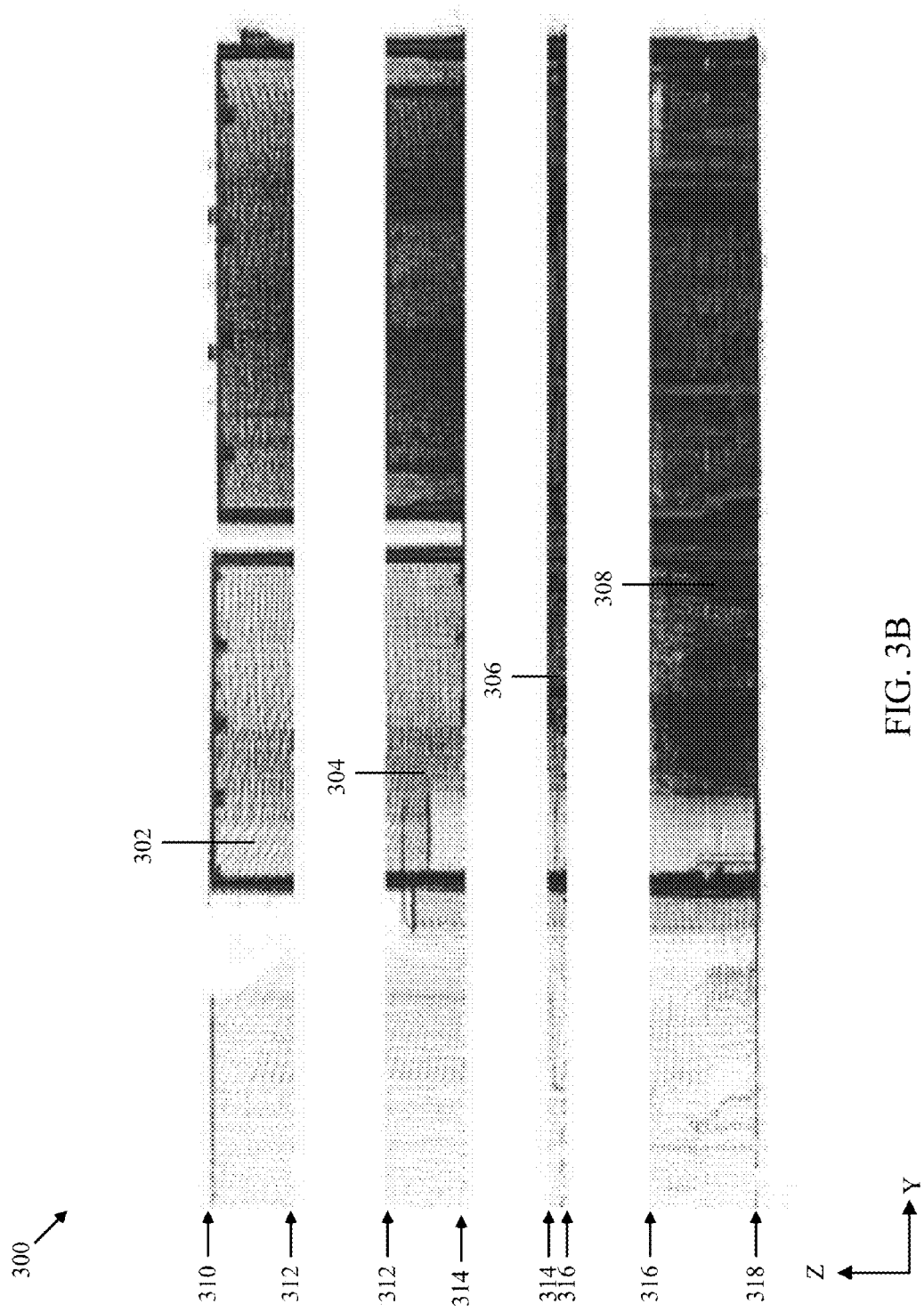
FIG. 3B illustrates an example of the plurality of 3D points divided into layers, in accordance with various aspects of the subject technology.
Figures 4A, 4B, 4C, 4D:
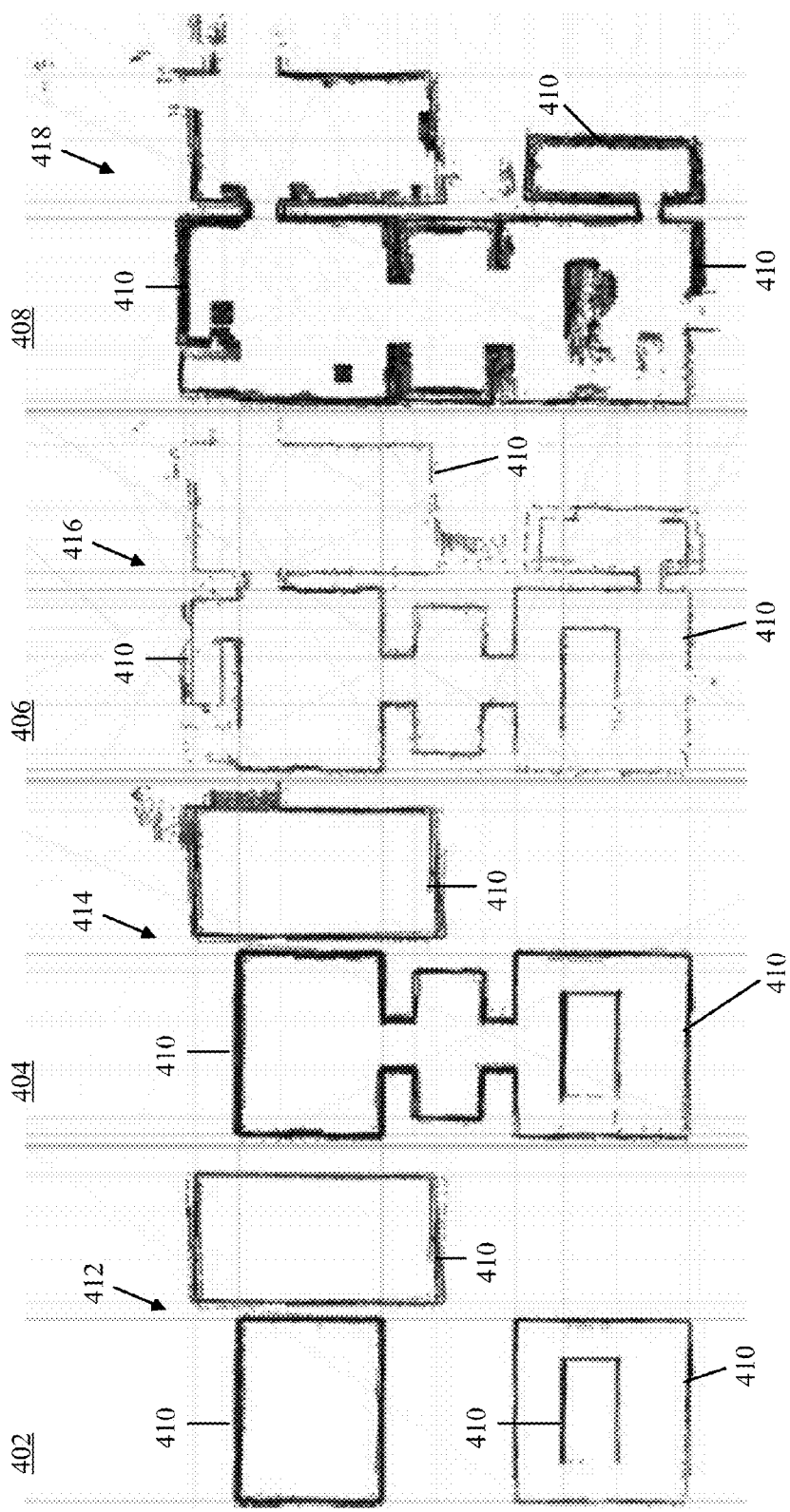
FIGS. 4A, 4B, 4C, and 4D illustrate a top view of examples of layouts, in accordance with various aspects of the subject technology.
Figure 6A:
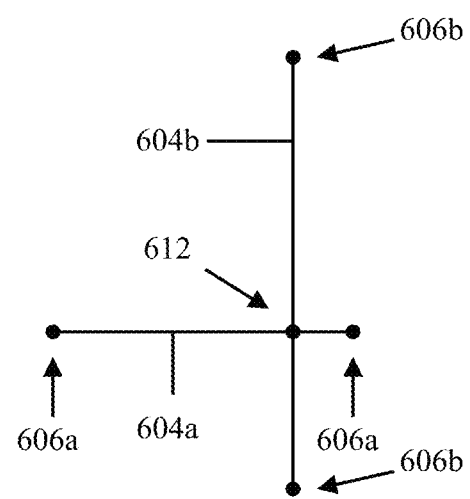
FIGS. 6A, 6B, 6C, 6D, 6E, 6F, 6G, 6H, 6I, and 6J illustrate examples of generating 2D primitives based on line segments, in accordance with various aspects of the subject technology.
Figure 6B:
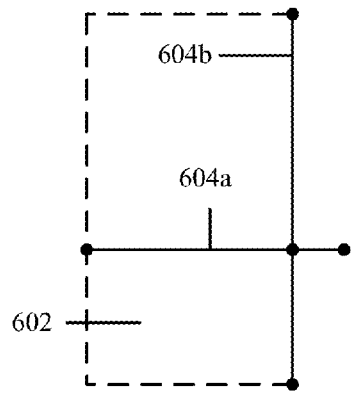
Figure 6C:
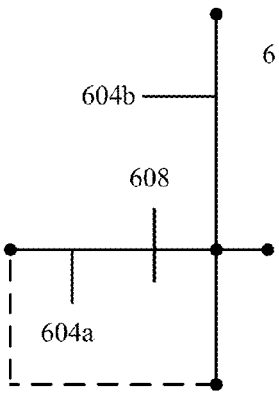
Figure 6D:
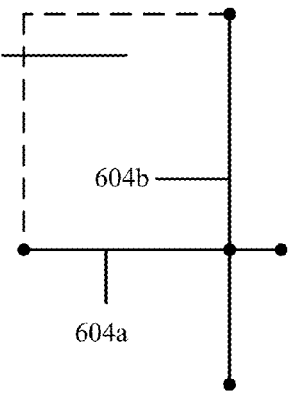
Figure 6E:
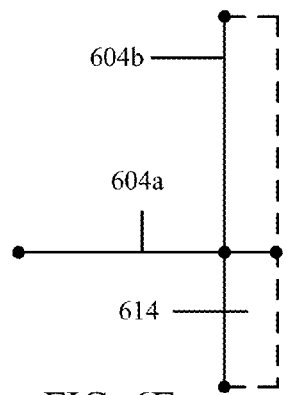
Figure 6F:
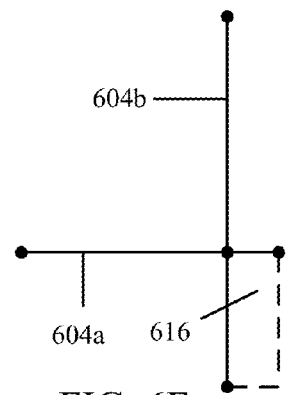
Figure 6G:
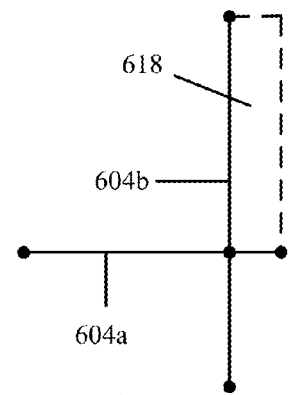
Figure 6H:
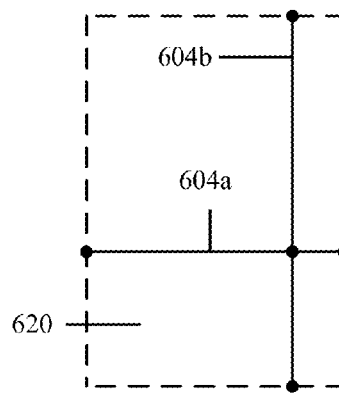
Figure 6I:
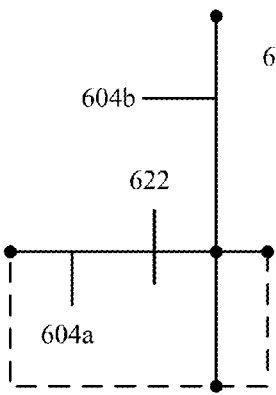
Figure 6J:
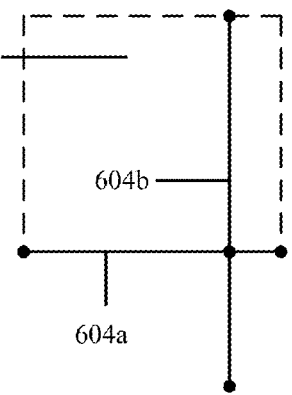

According to step S202 in FIG. 2, layer module 102 may identify one or more layers of the environment based on the plurality of 3D points 300. FIG. 3B illustrates an example of the plurality of 3D points 300 divided into layers 302, 304, 306, and 308, in accordance with various aspects of the subject technology. Each of these layers comprises corresponding ones of the plurality of 3D points 300. The plurality of 3D points 300 may be divided such that each of the layers may be at a separate elevation from one another (e.g., different floors of a structure). According to certain aspects, ceilings, floors, and other separations between layers of the environment may be mapped by more of the plurality of 3D points 300 than at other elevations of the environment. Thus, layer module 102 may identify elevations 310, 312, 314, 316, and 318 of the environment at which the plurality of 3D points 300 exceeds a predetermined layer threshold (e.g., forms a local maximum along a vertical direction), and divide the environment at the identified elevations to form layers 302, 304, 306, and 308. For example, a boundary (either upper or lower) of each of these layers may be formed at respective identified elevations 310, 312, 314, 316, or 318.

According to step S204 in FIG. 2, layout module 104 may generate a layout for each layer. Each layout, for example, may comprise a 2D model of the environment (e.g., a floor plan of a corresponding layer), and may be parallel with a ground plane of the environment. FIGS. 4A, 4B, 4C, and 4D illustrate a top view of examples of layouts 402, 404, 406, and 408, in accordance with various aspects of the subject technology. Layout 402 is a layout for layer 302, layout 404 is a layout for layer 304, layout 406 is a layout for layer 306, and layout 408 is a layout for layer 308. The 2D model of the environment at each layout (e.g., 2D models 412, 414, 416, and 418) may be used to generate the 3D model of the environment. The 2D model of each layout may comprise 2D primitives that may be added to one another and/or subtracted from one another to form a representation of a layout of the environment at a corresponding layer. For example, each 2D model may comprise a constructive solid geometry (CSG) model (e.g., a Boolean combination of two or more 2D primitives). The CSG model may be expressed as a binary tree with each leaf of the tree representing a 2D primitive and each node of the tree representing an operation for the Boolean combination, such as an intersection of two 2D primitives, a union of two 2D primitives, and/or a difference between two 2D primitives. According to certain aspects, each 2D primitive may comprise at least one of a rectangle, a triangle, an ellipse, and other suitable shapes.

To generate the 2D model of the environment for a particular layout, layout module 104 may project corresponding ones of the plurality of 3D points onto the particular layout. For example, the plurality of 3D points 300 are projected perpendicularly onto corresponding ones of layouts 402, 404, 406, and 408 to provide a top view of each layout in FIGS. 4A, 4B, 4C, and 4D. Layout module 104 may then generate one or more line segments 410 for each layout based on corresponding ones of the plurality of projected 3D points 300. For example, the one or more line segments 410 may be generated using a Hough transform or any other suitable techniques for line segment extraction. In some aspects, layout module 104 may assign the plurality of projected 3D points 300 to a nearest one of the one or more line segments 410, and may remove at least one of the one or more line segments 410 having less than a predetermined threshold number of projected 3D points assigned to it. In this way, the total number of line segments 410 may be reduced. Furthermore, layout module 104 may estimate at least one horizontal axis of each layout (e.g., the x-axis or y-axis), and may align at least one of the one or more line segments 410 with at least one of the horizontal axes. For example, layout module 104 may snap a particular line segment 410 to be parallel with the x-axis or y-axis if the particular line segment 410 is tilted in a similar manner as the x-axis or y-axis.

Layout module 104 may generate one or more 2D primitives for each layout based on corresponding ones of the one or more line segments 410. For example, at least one of the one or more line segments 410 may form at least a partial side of a corresponding 2D primitive. According to certain aspects, it may be desirable to exhaustively generate as many 2D primitives as possible based on the one or more line segments 410 so that a set of the 2D primitives that provides an accurate representation of the environment can be selected from the many 2D primitives. This set may be referred to as a 2D set.

FIGS. 5A, 5B, 5C, 5D, 5E, 5F, and 5G illustrate examples of generating 2D primitives 502, 508, 510, 512, 514, and 516 based on line segments 504a and 504b, in accordance with various aspects of the subject technology. Line segment 504a comprises endpoints 506a, and line segment 504b comprises endpoints 506b. Line segments 504a and 504b are parallel with one another. If it is determined that line segments 504a and 504b are within a predetermined distance of one another, then 2D primitives may be generated based on line segments 504a and 504b. For example, 2D primitives may be generated based on line segments 504a and 504b by extending lines from endpoints 506a and/or 506b to form a 2D primitive that uses line segments 504a, 504b, and/or the extended lines as its sides. For example, the extended lines may be parallel or perpendicular to line segments 504a or 504b, which may be useful for generating a rectangle. Using such an approach, various 2D primitives 502, 508, 510, 512, 514, and 516 in the shape of different-sized rectangles may be generated, as shown in FIGS. 5B, 5C, 5D, 5E, 5F, and 5G.

FIGS. 6A, 6B, 6C, 6D, 6E, 6F, 6G, 6H, 6I, and 6J illustrate examples of generating 2D primitives 602, 608, 610, 614, 616, 618, 620, 622, and 624 based on line segments 604a and 604b, in accordance with various aspects of the subject technology. Line segment 604a comprises endpoints 606a, and line segment 604b comprises endpoints 606b. Line segments 604a and 604b are perpendicular to one another, and also intersect one another at point 612. In this regard, 2D primitives may be generated based on line segments 604a and 604b. For example, 2D primitives may be generated based on line segments 604a and 604b by extending lines from endpoints 606a and/or 606b to form a 2D primitive that uses line segments 604a, 604b, and/or the extended lines as sides of the 2D primitive. For example, the extended lines may be parallel or perpendicular to line segments 604a or 604b, which may be useful for generating a rectangle. Using such an approach, various 2D primitives 602, 608, 610, 614, 616, 618, 620, 622, and 624 in the shape of different-sized rectangles may be generated, as shown in FIGS. 6B, 6C, 6D, 6E, 6F, 6G, 6H, 6I, and 6J.

Various sized and/or shaped 2D primitives may also be generated using greater than two line segments. For example, four rectangles may be generated if three line segments form a |_|-like shape by using a similar approach of extending lines from the endpoints of these line segments to form the 2D primitives. In another example, a single rectangle may be generated if four line segments already intersect with one another to form a rectangle shape. According to certain aspects, layout module 104 may exhaustively generate a plurality of 2D primitives based on the one or more line segments. After generating these 2D primitives, a 2D set of the 2D primitives that provides an accurate representation of the environment can be selected for generating the 2D model of each layout. For example, each 2D model may comprise a corresponding 2D set of the 2D primitives generated for a corresponding layout.

According to certain aspects, layout module 104 may remove at least one 2D primitive (from the exhaustive number of 2D primitives) having a dimension less than a predetermined threshold, thereby allowing very small and/or narrow 2D primitives that may not be useful for generating the 2D model of each layout to be removed. Layout module 104 may also remove at least one 2D primitive that is substantially the same as another of the one or more 2D primitives. In some aspects, layout module 104 may remove at least one 2D primitive having less than a predetermined number of projected 3D points adjacent to its edge within a predetermined distance. Thus, if a particular 2D primitive has a very few number of projected 3D points adjacent to its edges, this particular 2D primitive may be removed. Furthermore, if the disagreement of normal orientations of the projected 3D points adjacent to the edges is very large, then that particular 2D primitive can be removed.

According to various aspects of the subject technology, a matching score may be used to select the 2D set of 2D primitives. The matching score may be indicative of a degree of accuracy of the 2D set with respect to representing corresponding ones of the plurality of projected 3D points. For example, the higher the matching score, the more accurate the 2D set is with respect to representing corresponding ones of the plurality of projected 3D points. Aspects of the subject technology provide a method to maximize the matching score to obtain the 2D set of 2D primitives.

In some aspects, the 2D set comprises an initial one of the 2D primitives. The initial one of the 2D primitives may be selected as one that initially maximizes a matching score for the 2D set. Layout module 104 may determine an addition change in the matching score if a next one of the 2D primitives is added to the 2D set. Layout module 104 may also determine a subtraction change in the matching score if the next one is subtracted from the 2D set. Layout module 104 may also update the 2D set by adding the next one to the 2D set or subtracting the next one from the 2D set based on the addition change and the subtraction change. For example, the next one of the 2D primitives may be added to the 2D set or may be subtracted from the 2D set based on whether the addition change or the subtraction change increases the matching score by more than a predetermined threshold. In some aspects, the next one may be added to the 2D set if the addition change increases the matching score by more than the predetermined threshold. In contrast, the next one may not be added to the 2D set if the addition change does not increase the matching score by more than the predetermined. In some aspects, the next one may be subtracted from the 2D set if the subtraction change increases the matching score by more than the predetermined threshold. In contrast, the next one may not be subtracted from the 2D set if the subtraction change does not increase the matching score by more than the predetermined threshold. The 2D set may be updated accordingly depending on whether the next one of the 2D primitives is to be added to the 2D set or subtracted from the 2D set. Layout module 104 may iterate through the rest of the 2D primitives and repeat the foregoing steps (e.g., determining the addition change, determining the subtraction change, and updating the 2D set) with subsequent ones of the 2D primitives until the matching score is maximized. For example, millions of 2D primitives may be analyzed using the foregoing steps to select approximately five to six 2D primitives as part of the 2D set for generating a corresponding 2D model of the environment.

According to various aspects of the subject technology, the matching score may be given by $$w_s s(t) + w_p p(t) + w_r r(t), \quad (1)$$

where t is the 2D set of the 2D primitives, $w_s$ provides at least a portion of the matching score, s(t) is a function of t and adjusts the at least a portion of the matching score provided by $w_s$ based on an empty space of the environment, $w_p$ provides at least a portion of the matching score, p(t) is a function of t and adjusts the at least a portion of the matching score provided by $w_p$ based on a total number of projected 3D points of a corresponding layout, $w_r$ provides at least a portion of the matching score, and r(t) is a function of t and adjusts the at least a portion of the matching score provided by $w_r$ based on a perimeter of t, $w_w$, $w_p$, and $w_r$ may be assigned any suitable value for generating the matching score.

Figure 7A:
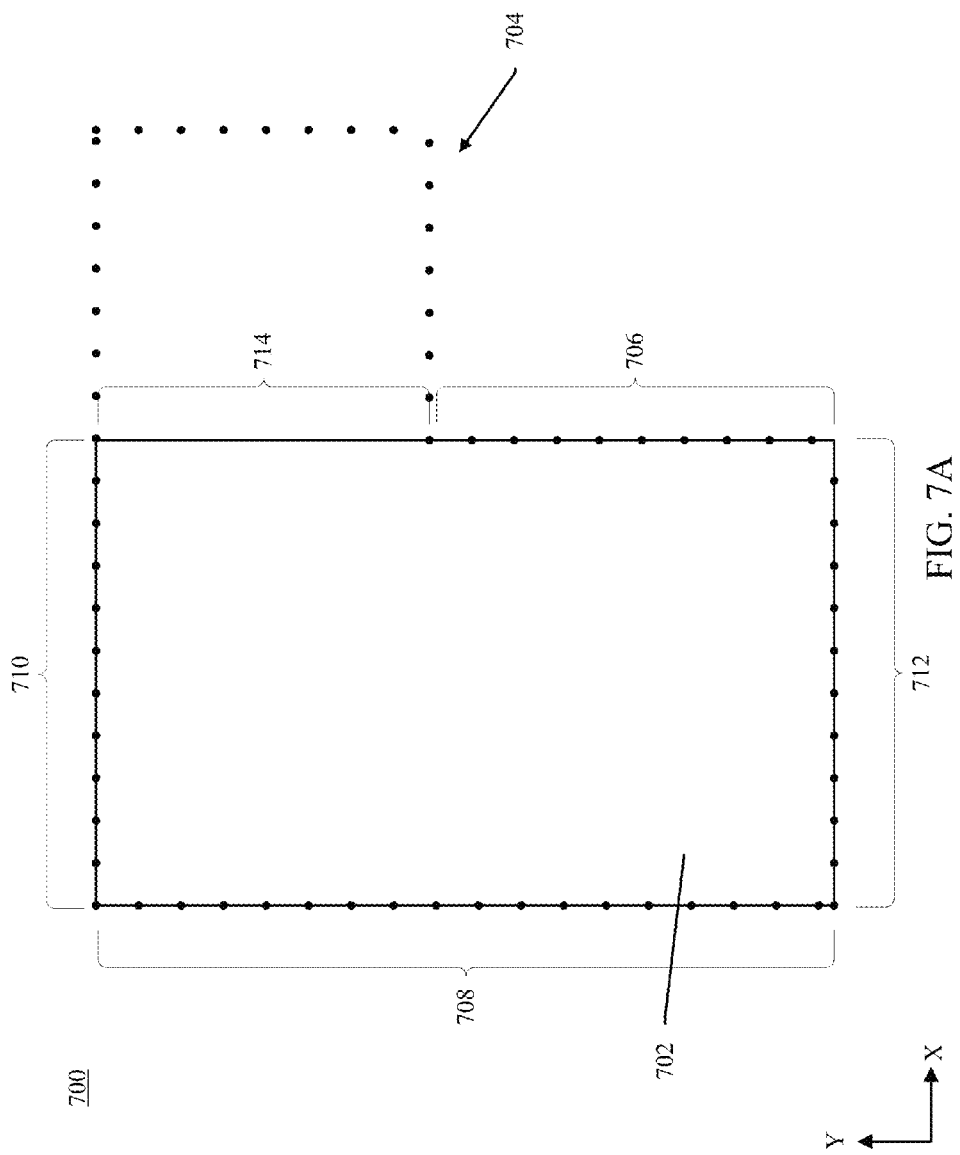
FIGS. 7A, 7B, and 7C illustrate examples of determining a matching score, in accordance with various aspects of the subject technology.
Figure 7B:
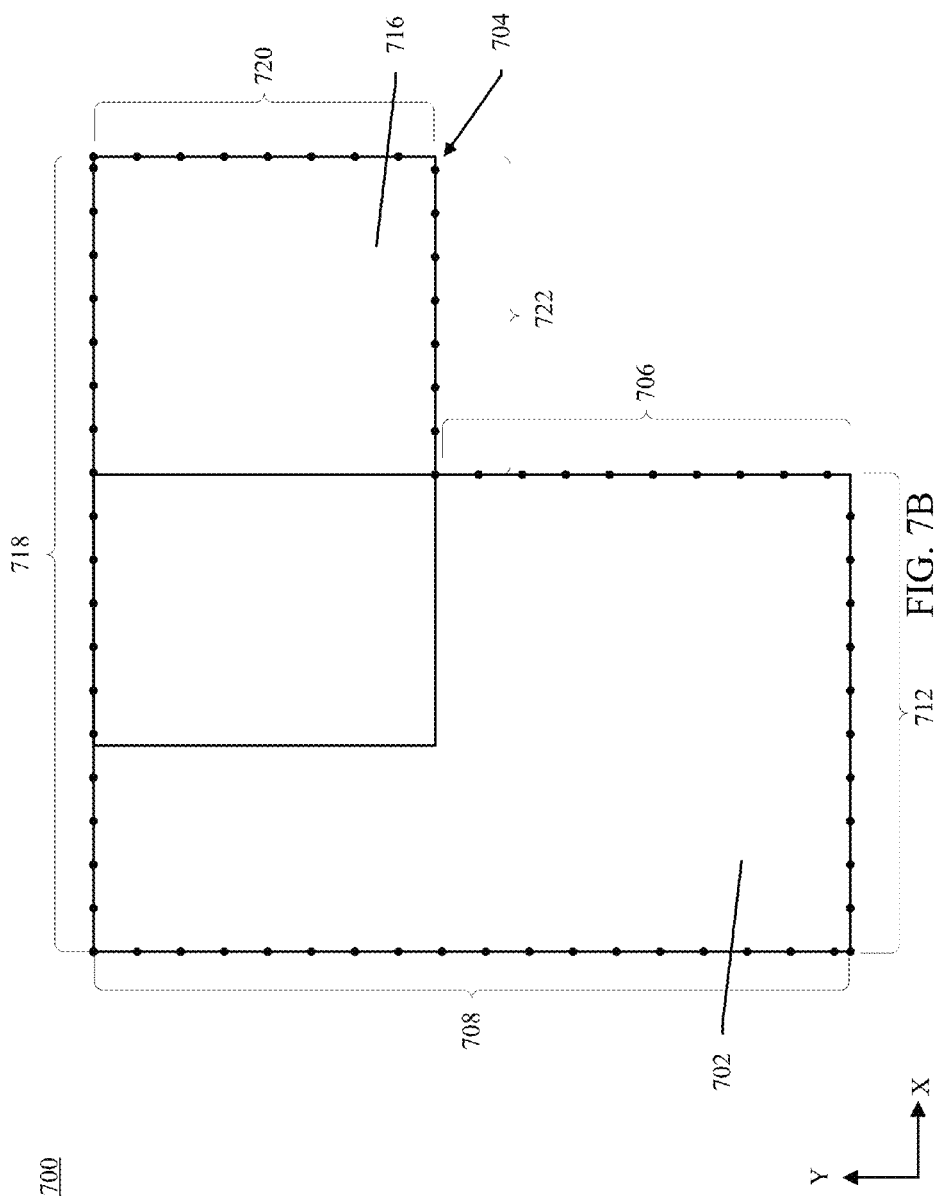

FIGS. 7A and 7B illustrate examples of determining the matching score using p(t) and r(t), in accordance with various aspects of the subject technology. FIG. 7A illustrates an example of layout 700, which comprises a 2D set t for generating a 2D model of the environment represented by a plurality of 3D points 704 (illustrated as dots) projected onto layout 700. The 2D set t comprises a single rectangle 702 as a 2D primitive. In computing the at least a portion of the matching score provided by $w_p$ with respect to the 2D set t, p(t) may be computed as a number of the plurality of projected 3D points 704 that are aligned with a perimeter of t (e.g., rectangle 704) divided by a total number of the plurality of projected 3D points 704. In other words, p(t) may be a ratio of the number of projected 3D points 704 that are accurately represented by rectangle 702 to the total number of projected 3D points 704. The higher this ratio is, the higher the matching score may be. As shown in FIG. 7A, p(t) may be computed as the number of projected 3D points 704 in areas 706, 708, 710, and 712 (e.g., areas where rectangle 702 and projected 3D points 704 overlap with one another) divided by the total number of projected 3D points 704.

Furthermore, in computing the at least a portion of the matching score provided by $w_r$ with respect to the 2D set t, r(t) may be computed as at least a portion of the perimeter of t (e.g., rectangle 702) that is aligned with corresponding ones of the plurality of projected 3D points 704 divided by the perimeter of t. In other words, r(t) may be a ratio of a portion of the perimeter of rectangle 702 that accurately represents the 2D model of the environment represented by the plurality of 3D points 704 to the total perimeter of rectangle 702. The higher this ratio is, the higher the matching score may be. As shown in FIG. 7A, r(t) may be computed as the length of the sides of rectangle 702 at areas 706, 708, 710, and 712 divided by the length of the sides of rectangle 702 at areas 706, 708, 710, 712, and 714.

FIG. 7B illustrates the example of layout 700 with a second rectangle 716 added to the 2D set t, in accordance with various aspects of the subject technology. As shown in FIG. 7B, the 2D set t comprises a union of rectangle 702 and 716. Compared to the 2D set t of FIG. 7A, the 2D set t of FIG. 7B more accurately represents the plurality of projected 3D points 704. As shown in FIG. 7B, the perimeter of t overlaps completely with the plurality of projected 3D points 704. In this regard, p(t) as computed with respect to FIG. 7B may be greater than p(t) as computed with respect to FIG. 7A. For example, p(t) may be computed as the number of projected 3D points 704 in areas 706, 708, 712, 718, 720, and 722 divided by the total number of projected 3D points 704. In this case, because the perimeter of t overlaps completely with the plurality of projected 3D points 704, p(t) provides a high ratio of about one, thereby maximizing the at least a portion of the matching score provided by $w_p$. Similarly, r(t) may be computed as the length of the sides of rectangle 702 at areas 706, 708, 712, 718, 720, and 722 divided by the length of the sides of rectangle 702 at areas 706, 708, 712, 718, 720, and 722. In this case, r(t) also provides a high ratio of about one, thereby maximizing the at least a portion of the matching score provided by $w_r$.

Figure 7C:
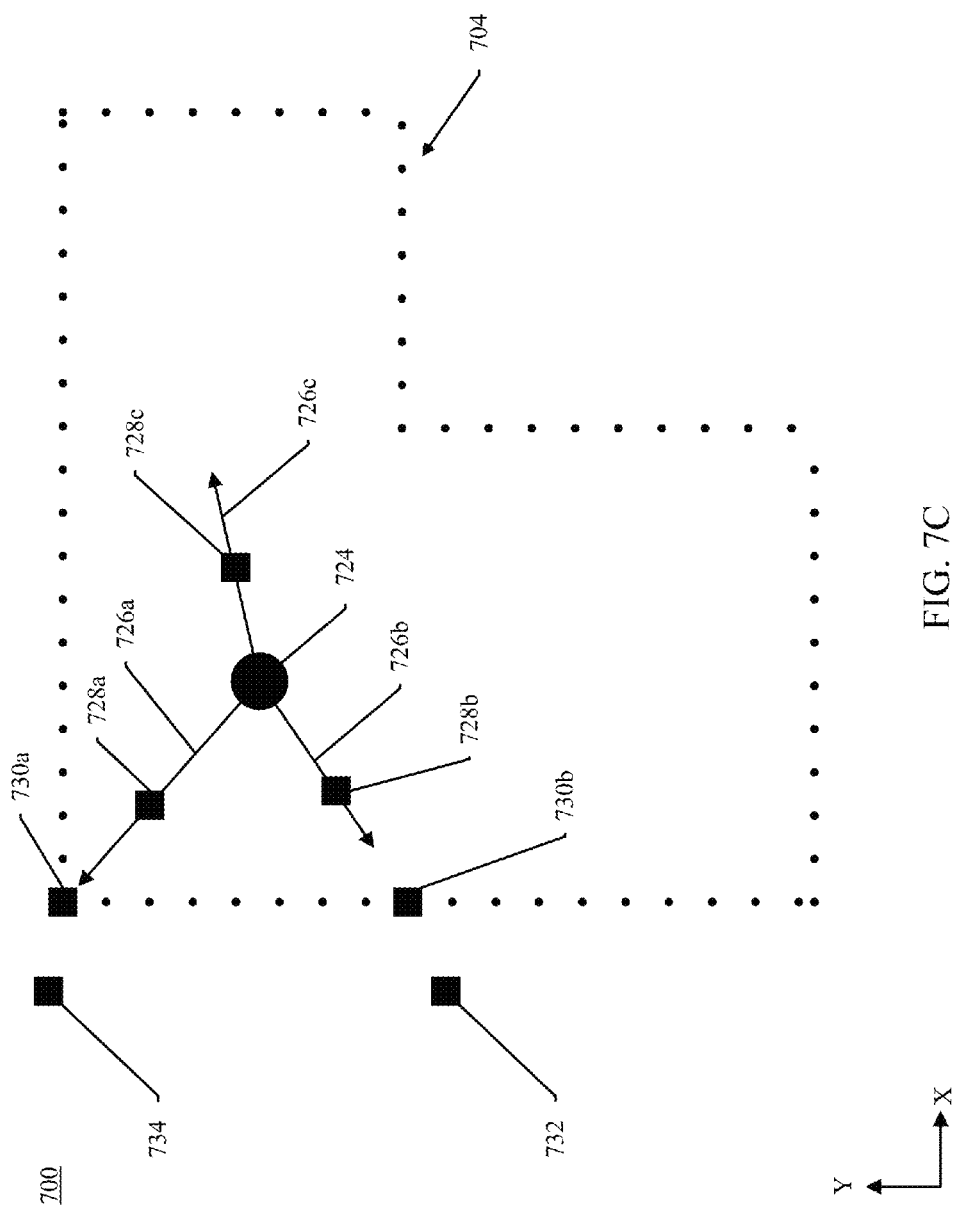

FIG. 7C illustrates an example of determining the matching score using s(t), in accordance with various aspects of the subject technology. As discussed above, trolley 724 may traverse the environment represented by the plurality of projected 3D points 704 in order to scan the environment with lasers and generate the plurality of 3D points of the environment. For example, trolley 724 may comprise one or more laser scanners that emit lasers 726a, 726b, and 726c towards the walls (or other suitable structures) of the environment, thereby generating the plurality of 3D points of the environment at the walls. The laser scans not only provide the plurality of 3D points of the environment, but also provide knowledge of whether or not a space between the trolley 724 and the walls of the environment is empty or not. This information about the empty space of the environment may be used to compute at least part of the matching score. In particular, s(t) may be based on the empty space of the environment.

According to certain aspects, layout 700 may be represented as a grid of pixels. However, since layout 700 is 2D instead of 3D, each pixel of layout 700 may also represent an aggregate of corresponding voxels of a layer of the environment associated with layout 700. In some aspects, s(t) may be given by $$s(t) = \frac{\sum_{i \in t} v_i}{\sum_{i | v_i > 0} v_i}, \quad (2)$$

where v is an emptiness score associated with a pixel of layout 700, and i is an identifier of a corresponding pixel associated with v. The emptiness score may be indicative of a count of the number of times a laser associated with corresponding ones of the plurality of projected 3D points intersected with the corresponding pixel. For example, since laser 726a intersects with pixel 728a, the count of pixel 728a may be one. However, the count of pixel 728a may increase when other lasers intersect with pixel 728a while trolley 724 is in other positions. Thus, the higher the count of a particular pixel, the greater the likelihood that the particular pixel is empty space. Similarly, since laser 726b intersects with pixel 728b, the count of pixel 728b may be one, although other lasers may increase this count. Since laser 726c intersects with pixel 728c, the count of pixel 728c may also be one, although other lasers may increase this count. According to certain aspects, since layout 700 is 2D, each pixel may be an aggregate of one or more corresponding voxels of a layer of the environment associated with layout 700.

In some aspects, each pixel at which a 3D point is generated may be given a zero count. For example, the 3D point at pixel 730a, which corresponds to laser 726a, may be given a zero count. The 3D point at pixel 730b, which corresponds to laser 726b, may be given a zero count. Pixels that never intersect with a laser, such as pixels 732 and 734, may also be given a zero count. In order to clearly differentiate pixels that are considered to be empty space (based on the emptiness score) from pixels that are not considered to be empty space (based on the emptiness score), large negative values may be assigned to those pixels with zero count. However, it may be desirable to have smooth transitions from pixels with positive counts to pixels with the large negative values. In this regard, for each $v_i$ having a zero count, layout module 104 may determine, using a distance transform (e.g., a Felzenszwalb and/or Huttenlocher transform), a distance from a corresponding pixel to a closest pixel having a positive count, and may assign a negative value to the corresponding $v_i$. The assigned negative value may be proportional to the distance. In this way, a smooth transition from pixels with positive counts to pixels with large negative values may be achieved.

According to certain aspects, s(t) may be considered a ratio of the summation of the emptiness scores of pixels inside the 2D set t to the summation of the emptiness scores of pixels having positive counts. In this regard, s(t) may provide an indication of how similar a shape of the 2D set t is to the shape of the environment represented by the plurality of projected 3D points. The higher this ratio is, the higher the matching score may be.

According to various aspects of the subject technology, layout module 104 may select one or more 2D primitives that maximizes the matching score given by equation (1). In this regard, the 2D set of 2D primitives comprises the selected ones of the 2D primitives. FIGS. 8A, 8B, 8C, and 8D illustrate 2D models 412, 414, 416, and 418 comprising the one or more selected 2D primitives 420 that form the 2D set, in accordance with various aspects of the subject technology. As shown in these figures, the one or more selected 2D primitives 420 are combined with one another to generate the 2D models 412, 414, 416, and 418. These 2D models are aligned accurately with the plurality of projected 3D points.

According to step S206 in FIG. 2, construction module 106 may generate a 3D model of the environment based on the 2D model of each layout (e.g., 2D models 412, 414, 416, and 418). The 3D model of the environment may be generated in a similar manner as each of the 2D models. For example, construction module 106 may generate a 3D primitive for each 2D primitive of the 2D set based on the one or more layers (e.g., layers 302, 304, 306, and 308). Each 3D primitive may comprise at least one of a cuboid, a polyhedron, an ellipsoid, and other suitable shapes. Construction module 106 may select a certain set of 3D primitives from the generated 3D primitives that provides an accurate representation of the environment. This set may be referred to as a 3D set. Construction module 106 may then generate the 3D model of the environment based on the 3D set. The 3D model, for example, may comprise 3D primitives from the 3D set that are added to one another and/or subtracted from one another to form a representation of the environment. For example, the 3D model may comprise a constructive solid geometry (CSG) model (e.g., a Boolean combination of two or more 3D primitives). This CSG model may be expressed as a binary tree with each leaf of the tree representing a 3D primitive and each node of the tree representing an operation for the Boolean combination, such as an intersection of two 3D primitives, a union of two 3D primitives, and/or a difference between two 3D primitives.

Figure 9:
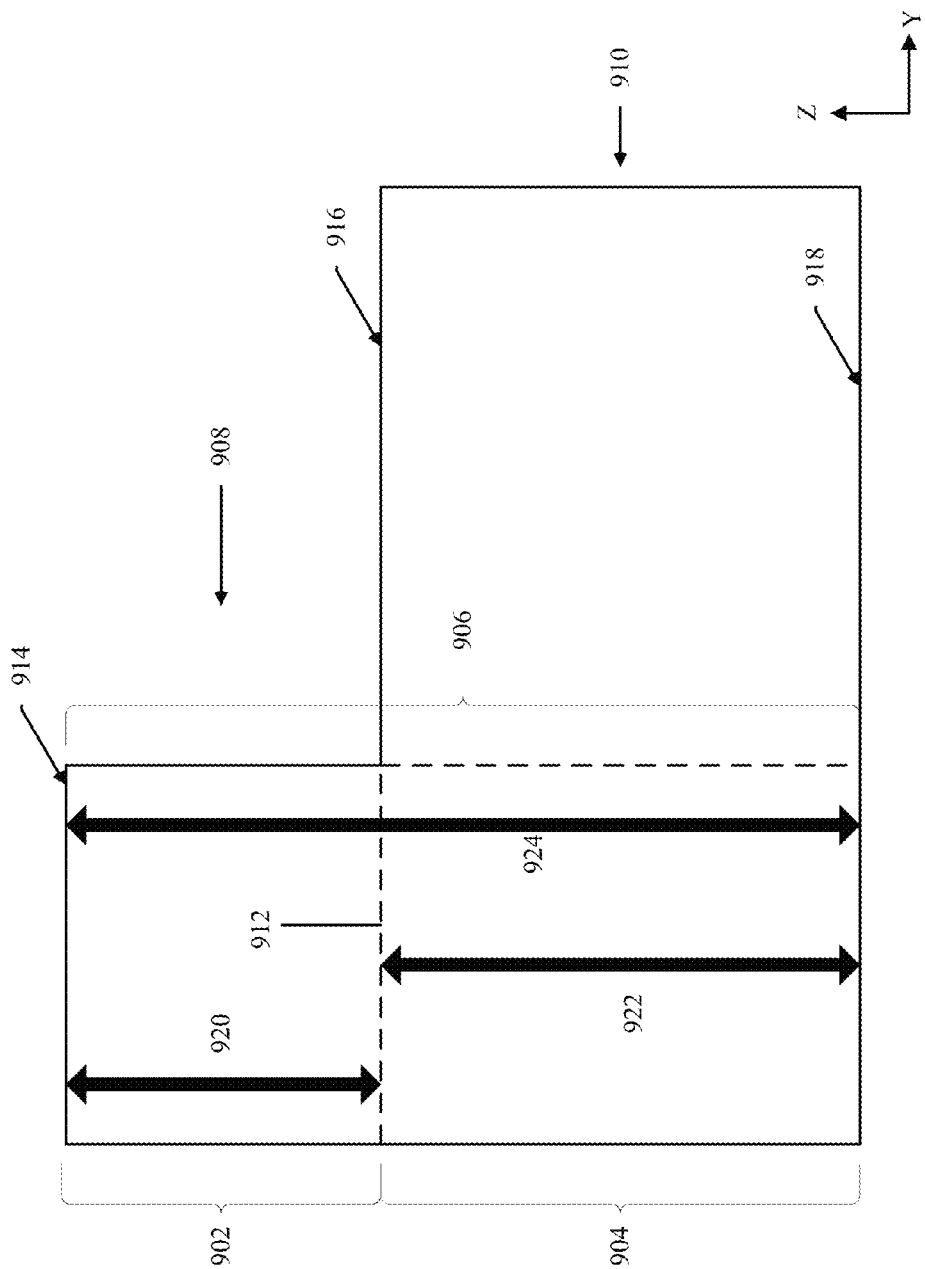
FIG. 9 illustrates an example of generating 3D primitives, in accordance with various aspects of the subject technology.

FIG. 9 illustrates, from a side view, an example of generating 3D primitives 902, 904, and 906, in accordance with various aspects of the subject technology. FIG. 9 also illustrates a side view of layers 908 and 910 of an environment. Boundary 914 forms an upper boundary of layer 908, while boundary 916 forms a lower boundary of layer 908. Boundary 916 also forms an upper boundary of layer 910, while boundary 918 forms a lower boundary of layer 910. A 2D primitive 912 of layer 908 may be used to generate 3D primitives 902, 904, and 906. For example, 2D primitive 912 may comprise a rectangle. 2D primitive 912 may be extended to boundaries 914 and/or 918 to generate 3D primitives 902, 904, and 906. Thus, 3D primitive 902 may be a cuboid extending between boundaries 914 and 916, and comprise height 920. 3D primitive 904 may be a cuboid extending between boundaries 916 and 918, and comprise height 922. Similarly, 3D primitive 906 may be a cuboid extending between boundaries 914 and 918, and comprise height 924. Similar to the generation of 2D primitives, it may be desirable to generate an exhaustive number of 3D primitives using different combinations of the boundaries of the one or more layers of the environment so that the 3D set may be selected to generate the 3D model.

After generating the exhaustive number of 3D primitives, the 3D set of 3D primitives that provides an accurate representation of the environment can be selected to generate the 3D model. According to certain aspects, construction module 106 may remove at least one 3D primitive having a dimension less than a predetermined threshold, thereby allowing very small and/or narrow 3D primitives that may not be useful for generating the 3D model to be removed. Construction module 106 may also remove at least one 3D primitive that is substantially the same as another of the one or more 3D primitives.

Similar to selecting the 2D primitives, a matching score may be used to select the 3D set of 3D primitives. The matching score may be indicative of a degree of accuracy of the 3D set with respect to representing the plurality of 3D points that maps the environment. For example, the higher the matching score, the more accurate the 3D set is with respect to representing the plurality of 3D points. Aspects of the subject technology provide a method to maximize the matching score to obtain the 3D set of 3D primitives.

In some aspects, the 3D set comprises an initial one of the 3D primitives. The initial one of the 3D primitives may be selected as one that initially maximizes a matching score for the 3D set. Construction module 106 may determine an addition change in the matching score if a next one of the 3D primitives is added to the 3D set. Construction module 106 may also determine a subtraction change in the matching score if the next one is subtracted from the 3D set. Construction module 106 may also update the 3D set by adding the next one to the 3D set or subtracting the next one from the 3D set based on the addition change and the subtraction change. For example, the next one of the 3D primitives may be added to the 3D set or may be subtracted from the 3D set based on whether the addition change or the subtraction change increases the matching score by more than a predetermined threshold. In some aspects, the next one may be added to the 3D set if the addition change increases the matching score by more than the predetermined threshold. In contrast, the next one may not be added to the 3D set if the addition change does not increase the matching score by more than the predetermined threshold. In some aspects, the next one may be subtracted from the 3D set if the subtraction change increases the matching score by more than the predetermined threshold. In contrast, the next one may not be subtracted from the 3D set if the subtraction change does not increase the matching score by more than the predetermined threshold. The 3D set may be updated accordingly depending on whether the next one of the 3D primitives is to be added to the 3D set or subtracted from the 3D set. Construction module 106 may iterate through the rest of the 3D primitives and repeat the foregoing steps (e.g., determining the addition change, determining the subtraction change, and updating the 3D set) with subsequent ones of the 3D primitives until the matching score is maximized.

Similar to the matching score for the 2D primitive selection, the matching score for the 3D primitive selection may be given by $$W_S S(T) + W_P P(T) + W_R R(T) \qquad (3)$$

where T is the 3D set of the 3D primitives, $W_S$ provides at least a portion of the matching score, S(T) is a function of T and adjusts the at least a portion of the matching score provided by $W_S$ based on an empty space of the environment, $W_P$ provides at least a portion of the matching score, P(T) is a function of T and adjusts the at least a portion of the matching score provided by $W_p$ based on a total number of 3D points of the environment, $W_R$ provides at least a portion of the matching score, and R(T) is a function of T and adjusts the at least a portion of the matching score provided by $W_R$ based on a surface area boundary of T. $W_S$, $W_P$, and $W_R$ may be assigned any suitable value for generating the matching score.

According to certain aspects, P(T) may be a 3D analogy of p(t), R(T) may be a 3D analogy of r(t), and S(T) may be a 3D analogy of s(t). For example, P(T) may be computed as a number of the plurality of 3D points that are aligned with a surface area boundary of T divided by a total number of the plurality of 3D points. R(T) may be computed as at least a portion of the surface area boundary of T that is aligned with corresponding ones of the plurality of 3D points divided by the surface area boundary of T.

According to certain aspects, the environment may be represented as a grid of voxels. Similar to s(t), S(T) may be given by $$S(T) = \frac{\sum_{I \in T} V_I}{\sum_{I | V_I > 0} V_I} \qquad (4)$$

where V is an emptiness score associated with a voxel of the environment, and I is an identifier of a corresponding voxel associated with V. This emptiness score may be indicative of a count of the number of times a laser associated with corresponding ones of the plurality of 3D points intersected with the corresponding voxel. Similar to computing s(t), construction module 106 may assign a negative value to each $V_I$ having a zero count. Furthermore, for each $V_I$ having a zero count, construction module 106 may determine, using a distance transform (e.g., a Felzenszwalb and/or Huttenlocher transform), a distance from a corresponding voxel to a closest voxel having a positive count, and may assign a negative value to the corresponding $V_I$. The assigned negative value may be proportional to the distance. In this way, a smooth transition from voxels with positive counts to voxels with large negative values may be achieved.

According to various aspects of the subject technology, construction module 106 may select one or more 3D primitives that maximizes the matching score given by equation (3). In this regard, the 3D set of 3D primitives comprises the selected ones of the 3D primitives.

According to certain aspects, construction module 106 may align faces of each of the 3D primitives with one another. For example, construction module 106 may snap a 3D primitive to align its boundaries with the boundaries of another 3D primitive. Construction module 106 may also remove a 3D primitive that has a dimension less than a predetermined threshold (e.g., the 3D primitive is small compared to other 3D primitives) and/or does not affect a space of the environment (e.g., the existence of the 3D primitive does not change any space of the environment).

Figure 10:
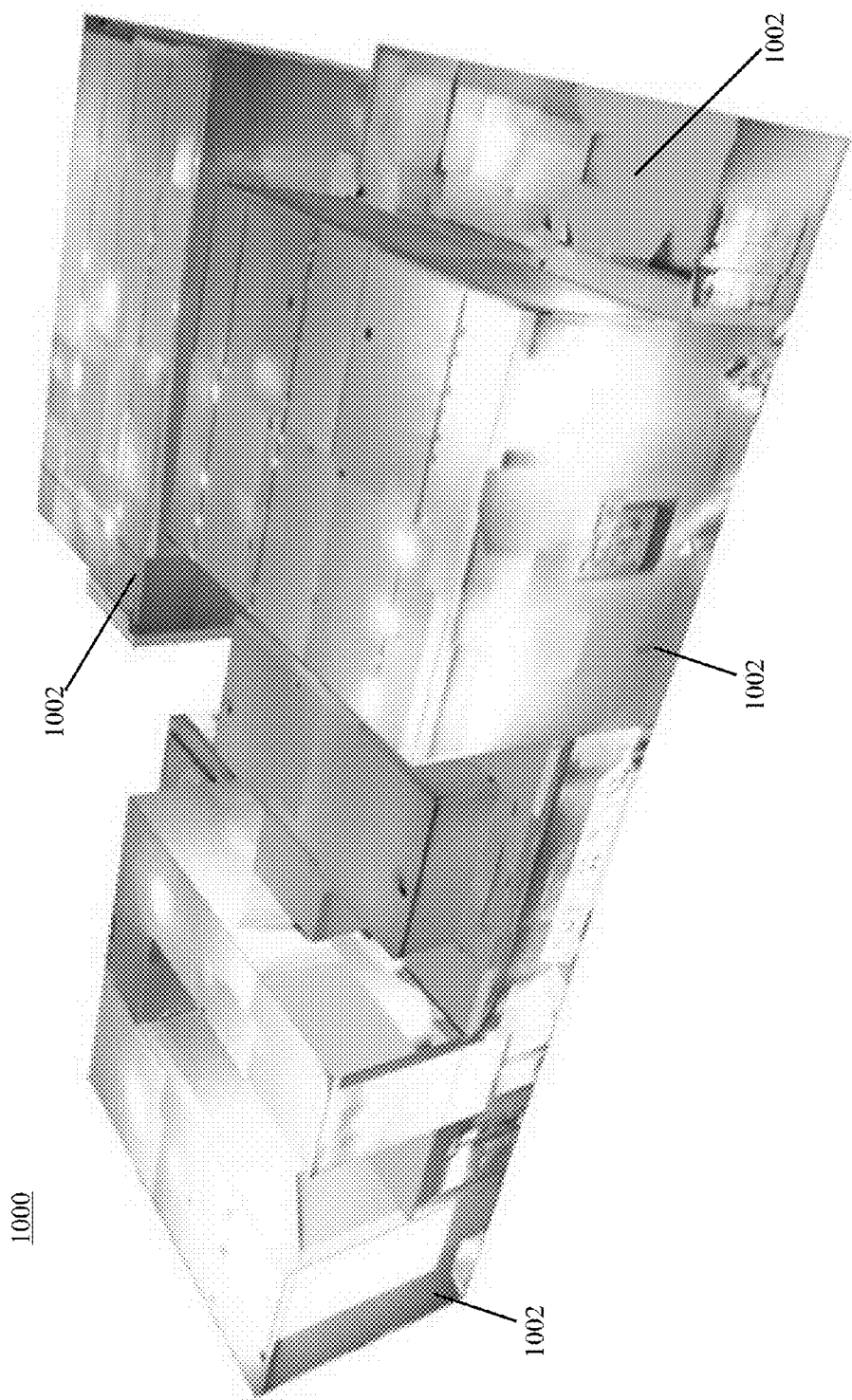
FIG. 10 illustrates an example of a 3D model, in accordance with various aspects of the subject technology.

Once the 3D set of 3D primitives has been selected, the 3D model of the model may be generated. As discussed above, the 3D model may comprise a CSG model. FIG. 10 illustrates an example of 3D model 1000, in accordance with various aspects of the subject technology. 3D model 1000, for example, may be a CSG model that comprises a Boolean combination of two or more 3D primitives 1002 from the 3D set. As shown in FIG. 10, 3D primitives 1002 comprise various sized cuboids. According to various aspects of the subject technology, it may be more convenient to render or manipulate a mesh model than a CSG model. In this regard, construction module 106 may convert 3D model 1000 (in the form of a CSG model) into a mesh model (e.g., a polygonal mesh model). Construction module 106 may convert the CSG model into the mesh model using a computational geometry algorithms library (CGAL) or other suitable techniques known to those of ordinary skill in the art.

According to various aspects of the subject technology, the 3D model of the environment may be prepared for display. For example, the 3D model of the environment may be displayed in a mapping application, thereby allowing a user to visualize the environment in the mapping application. If the environment is an indoor environment, for example, the 3D model may be a model of a structure that comprises the indoor environment. The mapping application may allow the user to not only view an outside of the structure (e.g., from an aerial view), but also an inside of the structure (e.g., using a view similar to a street-view that is typically used in various mapping applications). Aspects of the subject technology may modify the 3D model such that at least a portion of the inside of the structure may be visible to a user even from an aerial view. For example, one or more walls of the 3D model may be removed to allow a particular wall that the user desires to view (e.g., referred to as a target wall) to be visible from a particular viewing direction. Furthermore, aspects of the subject technology may map texture to the 3D model. In some aspects, the texture may allow the user to view certain visual details from inside the structure. For example, if the structure is a museum, the texture mapped to the target wall of the 3D model may be a painting displayed by the museum.

Figure 11:
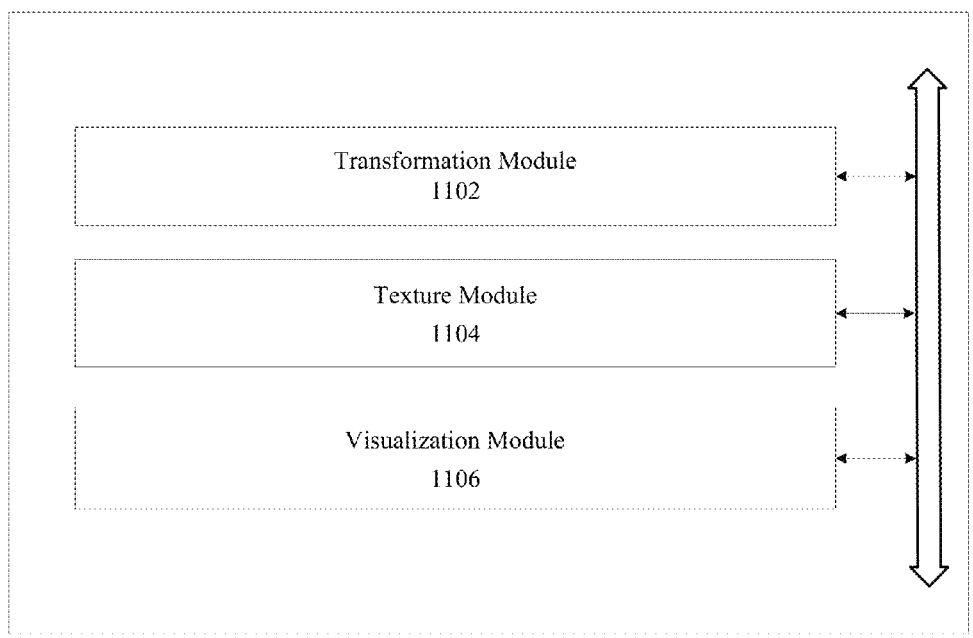
FIG. 11 illustrates an example of a system for preparing a model of an environment for display, in accordance with various aspects of the subject technology.

FIG. 11 illustrates an example of system 1100 for preparing a model of an environment for display, in accordance with various aspects of the subject technology. System 1100 comprises transformation module 1102, texture module 1104, and visualization module 1106. These modules may be in communication with one another. In some aspects, the modules may be implemented in software (e.g., subroutines and code). In some aspects, some or all of the modules may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both. Additional features and functions of these modules according to various aspects of the subject technology are further described in the present disclosure.

Figure 12:
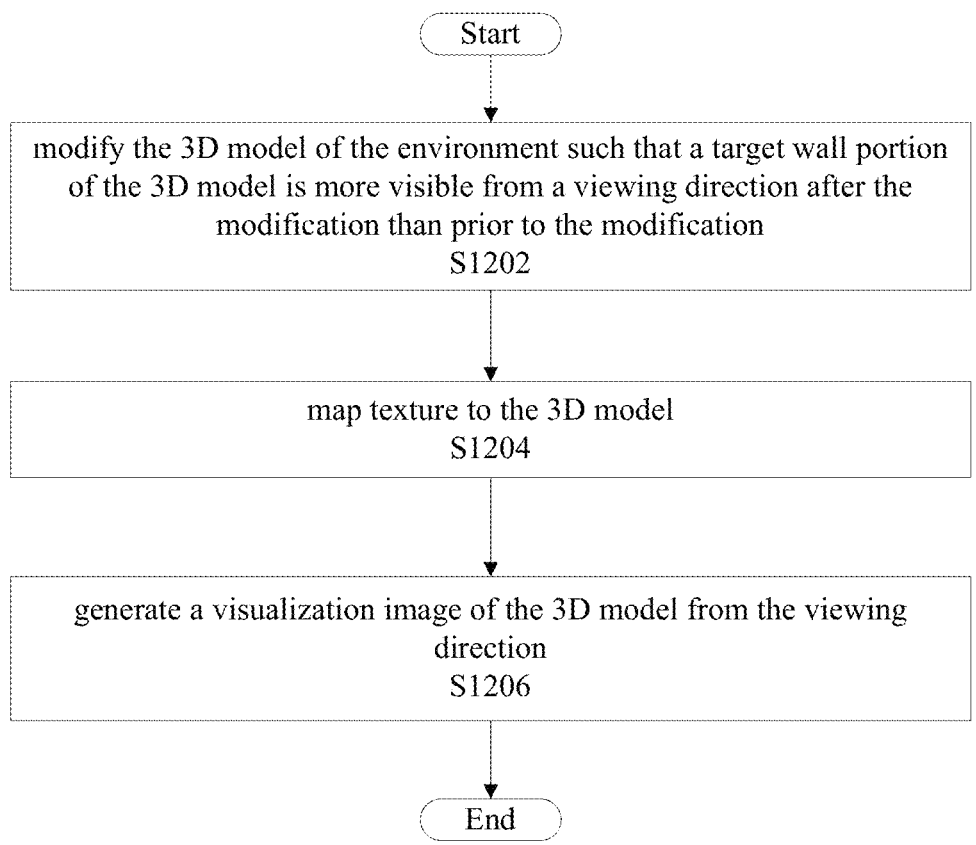
FIG. 12 illustrates an example of a method for preparing a model of an environment for display, in accordance with various aspects of the subject technology.

FIG. 12 illustrates an example of method 1200 for preparing a model of an environment for display, in accordance with various aspects of the subject technology. Method 1200, for example, may be implemented by system 1100. However, method 1200 may be implemented by other suitable systems having different configurations.

According to step S1202, transformation module 1102 may modify a 3D model of an environment such that a target wall portion of the 3D model is more visible from a viewing direction after the modification than prior to the modification. As discussed above, the 3D model may be a CSG model. According to certain aspects, the modification may be based on CSG and may comprise at least one of i) a removal of at least one ceiling wall portion of the 3D model, ii) a thickening of at least one lateral wall portion of the 3D model, and iii) a removal of an obstructing wall portion.

Figure 13G:
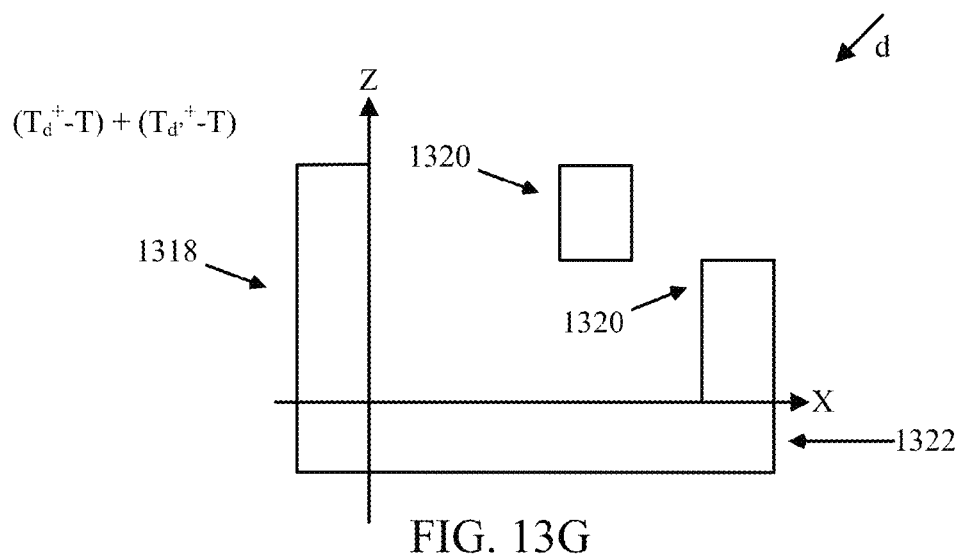

FIGS. 13A, 13B, 13C, 13D, 13E, 13F, and 13G illustrate a side view of examples of a 3D model T being modified, in accordance with various aspects of the subject technology. The 3D model T, for example, is shown in FIG. 13A with respect to an X-axis representing a horizontal direction and with respect to a Z-axis representing a vertical direction. The X-axis may also represent a ground plane of the environment. A viewing direction d represents a direction from which the 3D model T is viewed by the user. For example, the viewing direction d may be from a North direction, a South direction, an East direction, or a West direction.

The 3D model T comprises ceiling wall portion 1308, floor wall portion 1306, and at least one lateral wall portion. The ceiling wall portion 1308 is parallel to the floor wall portion 1306. The ceiling wall portion 1308 is also perpendicular to the at least one lateral wall portion. Although ceiling wall portion 1308 is described as being parallel to floor wall portion 1306, ceiling wall portions of the 3D model do not necessarily have to be parallel to floor wall portions of the 3D model. For example, the ceiling wall portions may be curved and/or tilted with respect to the floor wall portions. Furthermore, although ceiling wall portion 1308 is described as being perpendicular to the at least one lateral wall portion, ceiling wall portions of the 3D model do not necessarily have to be perpendicular to the at least one lateral wall portion. For example, the ceiling wall portions and the at least one lateral wall portion may be curved and/or tilted with respect to one another. In some aspects, the at least one lateral wall portion comprises target wall portion 1302, which may be an area of 3D model T that the user may desire to view from the viewing direction d. The at least one lateral wall portion also comprises obstructing wall portion 1304, which may block at least a partial view of the target wall portion 1302 from the viewing direction d. As shown, obstructing wall portion 1304 is opposite target wall portion 1302, and is also parallel to target wall portion 1302. However, obstructing wall portion 1304 does not necessarily have to be parallel to and/or opposite target wall portion 1302. For example, obstructing wall portion 1304 and target wall portion 1302 may be curved and/or tilted with respect to one another.

According to various aspects of the subject technology, the modification of the 3D model T may remove ceiling wall portion 1308 and also make the at least one lateral wall portion thicker. For example, as shown in FIG. 13B and represented as $T_d^+$, transformation module 1102 may expand the 3D model T along a horizontal vector component of the viewing direction d and/or a vertical vector component of the viewing direction d. In other words, the viewing direction d may be broken down into the horizontal vector component (e.g., parallel to the ground plane of the environment) and the vertical vector component (e.g., perpendicular to the ground plane of the environment). According to certain aspects, transformation module 1102 may expand the 3D model T such that the 3D model T is expanded along direction 1310, which is in the same direction as the horizontal vector component of the viewing direction d, and along direction 1312, which is in the same direction as the vertical component of the viewing direction d. According to certain aspects, transformation module 1102 may subtract the 3D model T from the expanded 3D model $T_d^+$ to generate a first intermediate version of the 3D model T, as illustrated in FIG. 13C.

FIGS. 13D, 13E, and 13F illustrate the 3D model T being modified in a similar manner as illustrated in FIGS. 13A, 13B, and 13C, but with respect to a reverse direction d'. For example, the reverse direction d' may be diametrically opposed to the viewing direction d about a vertical axis perpendicular to the ground plane of the environment. In some aspects, this vertical axis may be positioned at an approximate center of the 3D model T. As shown in FIG. 13E and represented as $T_d^+$, transformation module 1102 may expand the 3D model T along a horizontal vector component of the reverse direction d' and/or a vertical vector component of the reverse direction d'. For example, transformation module 1102 may expand the 3D model T such that the 3D model T is expanded along direction 1314, which is in the same direction as the horizontal vector component of the reverse direction d', and along direction 1316, which is in the same direction as the vertical component of the reverse direction d'. According to certain aspects, transformation module 1102 may subtract the 3D model T from $T_d^+$, to generate a second intermediate version of the 3D model T, as illustrated in FIG. 13F.

In some aspects, the modified 3D model may comprise the first intermediate version of the 3D model (e.g., illustrated in FIG. 13C) added to the second intermediate version of the 3D model (e.g., illustrated in FIG. 13F). In other words, the modified 3D model may be given by $(T_d^+-T)+(T_{d'}^+-T)$. This union of the first intermediate version of the 3D model and the second intermediate version of the 3D model is illustrated in FIG. 13G. In comparing the modified 3D model in FIG. 13G to the original 3D model T in FIG. 13A, it can be seen that the ceiling wall portions of the 3D model T are removed, and the at least one lateral wall portion is thickened. In particular, target wall portion 1318 in FIG. 13G is thickened relative to target wall portion 1302 in FIG. 13A, while obstructing wall portion 1320 in FIG. 13G is thickened relative to obstructing wall portion 1304 in FIG. 13A. Floor wall portion 1322 in FIG. 13G is also thickened relative to floor wall portion 1306 in FIG. 13A, but because it is below the ground plane of the environment, this thickened wall portion may not necessarily be visible to the user.

Figure 14A:
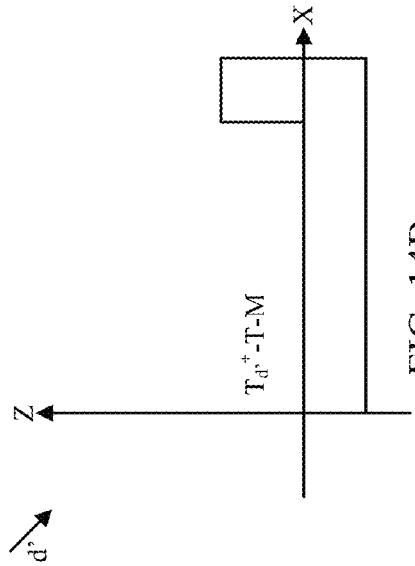
FIGS. 14A, 14B, and 14C illustrate a side view of examples of a 3D model being modified using a removal primitive to remove an obstructing wall portion, in accordance with various aspects of the subject technology.
Figure 14B:
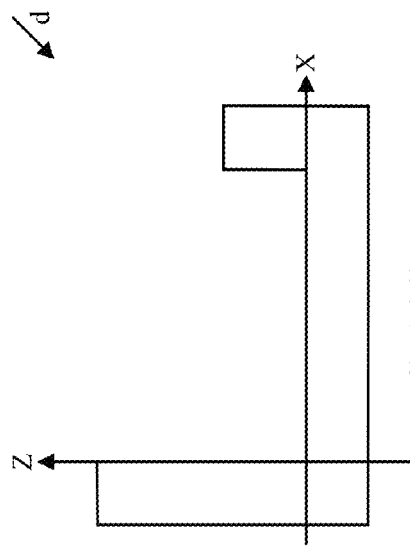
Figure 14C:
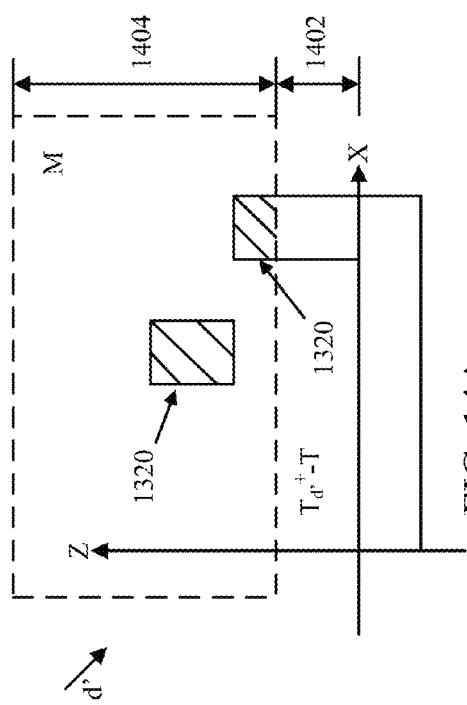

According to various aspects of the subject technology, transformation module 1102 may also remove obstructing wall portion 1304. FIGS. 14A, 14B, and 14C illustrate a side view of examples of the 3D model T being modified using a removal primitive M to remove the obstructing wall portion 1304 by removing the thickened obstructing wall portion 1320, in accordance with various aspects of the subject technology. For example, transformation module 1102 may modify the second intermediate version of the 3D model T in FIG. 13F to remove obstructing wall portion 1320. As shown in FIGS. 14A and 14B, transformation module 1102 may subtract the removal primitive M from the second intermediate version of the 3D model such that the obstructing wall portion 1320 is removed. The removal primitive M may be a cuboid, a polyhedron, an ellipsoid, or any suitable primitive that may be used to remove obstructing wall portion 1320. The removal primitive M may be positioned at a predetermined distance 1402 above a ground plane of the environment (e.g., from 1 meter to 2 meters) so that any lateral wall portion above this distance 1402 may be removed (such as the obstructing wall portion 1320), while any lateral wall portion below this distance 1402 may be retained as part of the modified 3D model. According to certain aspects, a height 1404 of the removal primitive M may be substantially greater than a height of the 3D model, which may ensure that any lateral wall portion greater than the predetermined distance 1402 is removed. Using the removal primitive M, the modified 3D model may therefore be given by $(T_d^+-T)+(T_{d'}^+-T-M)$, which is illustrated in FIG. 14C.

According to certain aspects, it may be desirable to remove other "floating" lateral wall portions that may be a part of the target wall portion, the obstructing wall portion, or the ceiling wall portion. In this regard, the same steps as illustrated in FIGS. 13A, 13B, 13C, 13D, 13E, 13F, 13G, 14A, 14B, and 14C may be performed, except that instead of subtracting the 3D model T from the thickened versions of the 3D model T (e.g., $T_d^+$ or $T_{d'}^+$), a modified 3D model T, represented as $T^-$, may be subtracted from the thickened versions of the 3D model T. To generate $T^-$, transformation module 1102 may expand the 3D model T to a height substantially greater than a height of the 3D model. Subtracting $T^-$ from the thickened versions of the 3D model T may ensure that the floating wall portions are removed. According to certain aspects, the modified 3D model may therefore be given by $(T_d^+-T^-)+(T_{d'}^+-T^--M)$, where $T^-$ is the 3D model expanded to a height substantially greater than a height of the 3D model.

Figure 15A:
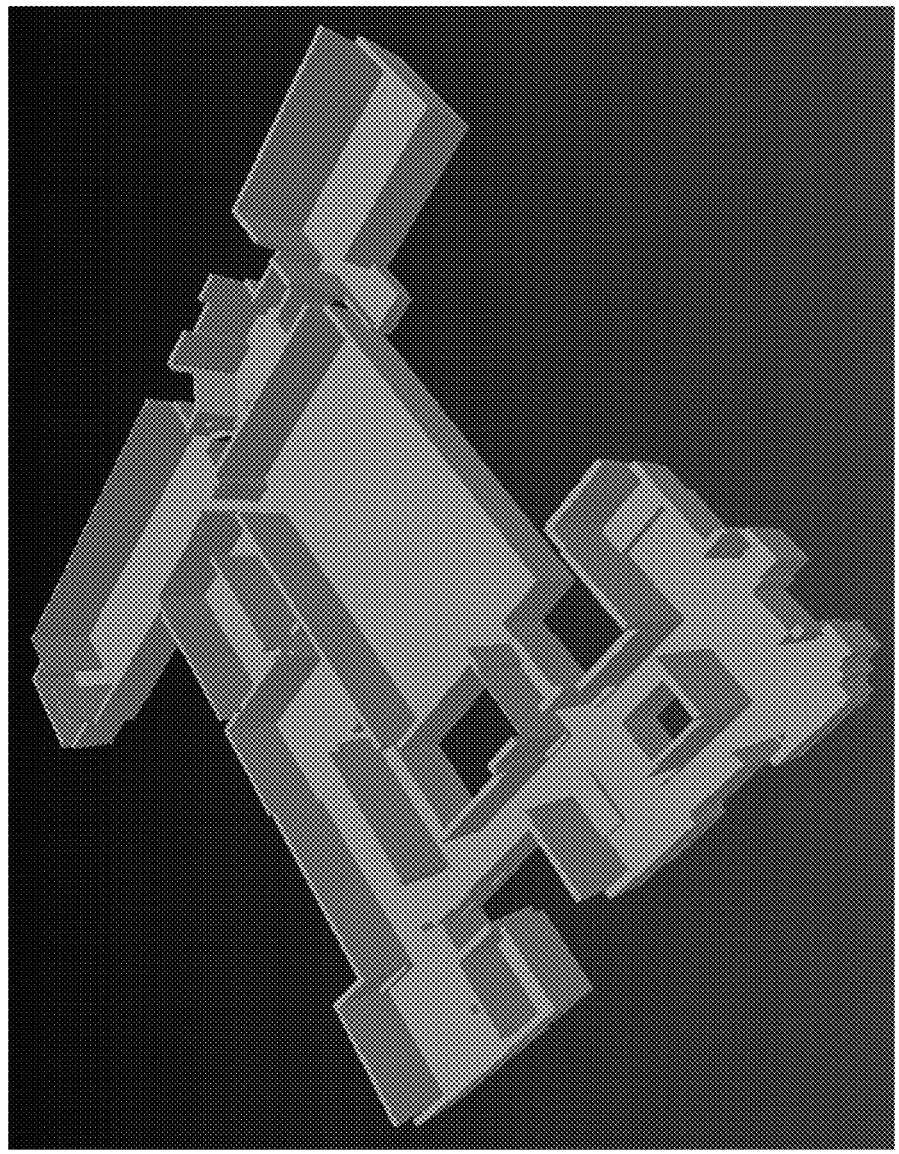
FIG. 15A illustrates an aerial view of an example of a 3D model that has been modified to allow one or more lateral wall portions to be visible, in accordance with various aspects of the subject technology.

FIG. 15A illustrates an aerial view of an example of 3D model 1500 that has been modified to allow one or more lateral wall portions to be visible, in accordance with various aspects of the subject technology. According to step S1204 in FIG. 12, texture module 1104 may map texture to 3D model 1500. According to certain aspects, the trolley as discussed above may not only collect laser 3D points, but also a plurality of images of the environment as the trolley traverses the environment. Texture module 1104 may map texture to 3D model 1500 using the plurality of images.

According to certain aspects, texture module 1104 may select one or more images from the plurality of images of the environment, and map the selected one or more images to 3D model 1500. Texture module 1104 may select the one or more images and map the selected one or more images using an image-stitching technique or other suitable technique known to one of ordinary skill in the art. In particular, the one or more images may be selected such that the visibility of boundaries between adjacent images mapped to the 3D model 1500 is minimized and does not disrupt any important information that is desired to be shown to the user (e.g., having a boundary in the middle of a painting may be undesirable, as it may distort a view of the painting). In this regard, texture module 1104 may select the one or more images using a Markov Random Field technique or other suitable technique known to one or ordinary skill in the art to select appropriate images such that the boundaries between the selected images is not noticeable to the user. For example, the images may be selected such that the boundaries are generated between the same colors. In this regard, the boundaries may not be as noticeable to the user.

Figure 15B:
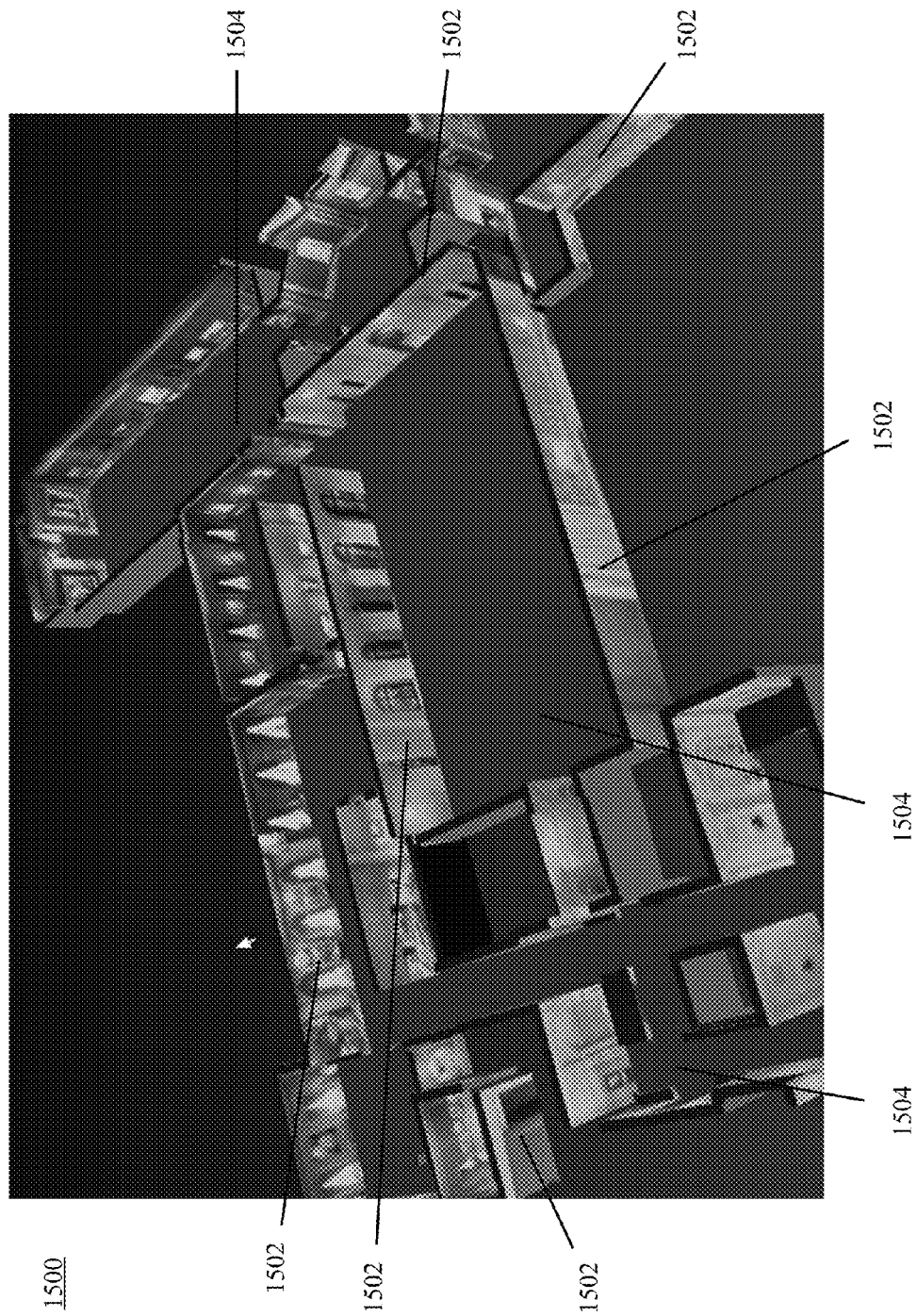
FIG. 15B illustrates an aerial view of an example of a 3D model with texture mapped thereon, in accordance with various aspects of the subject technology.

FIG. 15B illustrates an aerial view of an example of 3D model 1500 with texture mapped thereon, in accordance with various aspects of the subject technology. As shown in FIG. 15B, the texture mapped to surfaces 1502 of the lateral wall portions of 3D model 1500 comprise the selected one or more images of the plurality of images. These images, when mapped to surfaces 1502, provide a view of what the environment looks like. However, if 3D model 1500 is a very large model (e.g., the 3D model is of a structure with dozens of rooms), then applying the image-stitching technique to map the selected one or more images may not scale very well for such a large model. In this regard, aspects of the subject technology may map texture to groups of surfaces 1502 at a time. For example, texture module 1104 may group one or more surfaces 1502 of 3D model 1500. The grouped one or more surfaces may be grouped if they are substantially coplanar with one another. From a set of the plurality of images that correspond to the grouped one or more surfaces 1502, texture module 1104 may select the one or more images from this set and map these images to the grouped one or more surfaces 1502. This process may be repeated with other surfaces of 3D model 1500 until all the surfaces of 3D model 1500 are mapped with a desired texture.

While images are shown in FIG. 15B as mapped to lateral wall portions, texture module 1104 may also select and map images to ceiling wall portions. Furthermore, because attention is typically focused on the lateral wall portions, surfaces 1504 of floor wall portions may be mapped with texture that does not correspond to images collected from the trolley. Rather, texture module 1104 may map a predetermined texture to surfaces 1504 of the floor wall portions, such as mapping a solid color to surfaces 1504. In this regard, texture module 1104 may identify one or more wall portions that are substantially coplanar with the ground plane of the environment and are within a predetermined distance of the ground plane. For example, the floor wall portions may comprise the identified one or more wall portions. Texture module 1104 may map the predetermined texture to the identified one or more wall portions.

According to various aspects of the subject technology, the 3D model with texture mapped thereon may be displayed in a mapping application. For example, the mapping application may be running on an electronic device, which allows the user to view the 3D model. The electronic device, for example, may comprise at least one of a laptop computer, a desktop computer, a netbook, a mobile phone, a tablet, and other suitable devices for displaying the 3D model to the user. When the user navigates around a geographic area that comprises the 3D model using the mapping application, the mapping application may transmit a request to system 1100 for a map tile corresponding to the geographic area. According to step S1206 in FIG. 12, visualization module 1106 may generate a visualization image of the 3D model from one or more desired viewing directions (e.g., from a North direction, a South direction, a West direction, and/or an East direction). In some aspects, the visualization image may comprise an oblique image, such as an aerial-like image of the 3D model taken from about a 45-degree angle from a normal to the ground plane of the environment. Visualization module 1106 may package the visualization image with a map tile corresponding to the geographic area, and may transmit the map tile and the visualization image to the electronic device in response to the request for the map tile. In some aspects, the visualization image may be a pre-rendered image of the 3D model that will allow the user to visualize the 3D model from the aerial view.

Figure 16:
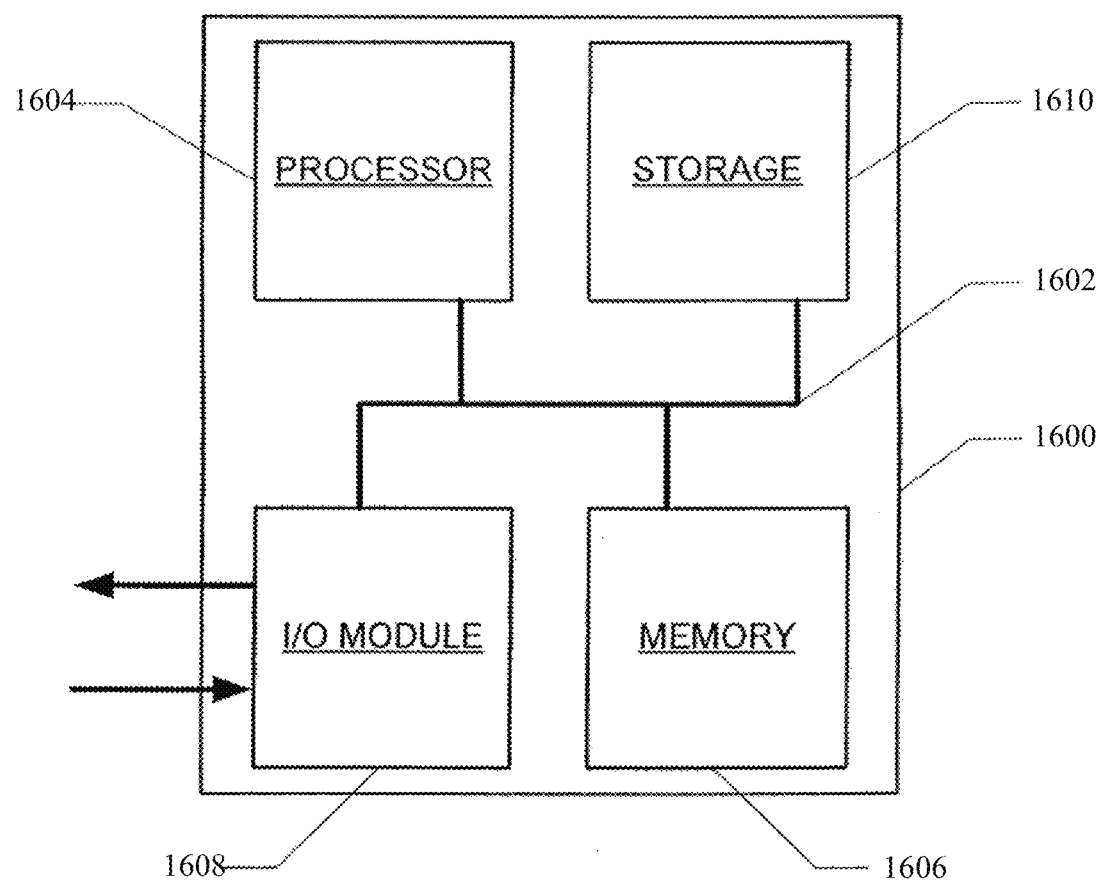
FIG. 16 is a block diagram illustrating components of a controller, in accordance with various aspects of the subject technology.

FIG. 16 is a block diagram illustrating components of controller 1600, in accordance with various aspects of the subject technology. Controller 1600 comprises processor module 1604, storage module 1610, input/output (I/O) module 1608, memory module 1606, and bus 1602. Bus 1602 may be any suitable communication mechanism for communicating information. Processor module 1604, storage module 1610, I/O module 1608, and memory module 1606 are coupled with bus 1602 for communicating information between any of the modules of controller 1600 and/or information between any module of controller 1600 and a device external to controller 1600. For example, information communicated between any of the modules of controller 1600 may include instructions and/or data. In some aspects, bus 1602 may be a universal serial bus. In some aspects, bus 1602 may provide Ethernet connectivity.

In some aspects, processor module 1604 may comprise one or more processors, where each processor may perform different functions or execute different instructions and/or processes. For example, one or more processors may execute instructions for operating system 100, one or more processors may execute instructions for generating a model of an environment, one or more processors may execute instructions for preparing a model of an environment for display, and one or more processors may execute instructions for input/output functions.

Memory module 1606 may be random access memory ("RAM") or other dynamic storage devices for storing information and instructions to be executed by processor module 1604. Memory module 1606 may also be used for storing temporary variables or other intermediate information during execution of instructions by processor 1604. In some aspects, memory module 1606 may comprise battery-powered static RAM, which stores information without requiring power to maintain the stored information. Storage module 1610 may be a magnetic disk or optical disk and may also store information and instructions. In some aspects, storage module 1610 may comprise hard disk storage or electronic memory storage (e.g., flash memory). In some aspects, memory module 1606 and storage module 1610 are both a machine-readable medium.

Controller 1600 is coupled via I/O module 1608 to a user interface for providing information to and receiving information from an operator of system 100 and/or system 1100. For example, the user interface may be a cathode ray tube ("CRT") or LCD monitor for displaying information to an operator. The user interface may also include, for example, a keyboard or a mouse coupled to controller 1600 via I/O module 1608 for communicating information and command selections to processor module 1604.

According to various aspects of the subject disclosure, methods described herein are executed by controller 1600. Specifically, processor module 1604 executes one or more sequences of instructions contained in memory module 1606 and/or storage module 1610. In one example, instructions may be read into memory module 1606 from another machine-readable medium, such as storage module 1610. In another example, instructions may be read directly into memory module 1606 from I/O module 1608, for example from an operator of system 100 and/or system 1100 via the user interface. Execution of the sequences of instructions contained in memory module 1606 and/or storage module 1610 causes processor module 1604 to perform methods to generate a model of an environment and/or methods to prepare a model of an environment for display. For example, a computational algorithm for generating a model of an environment and/or for preparing a model of an environment for display may be stored in memory module 1606 and/or storage module 1610 as one or more sequences of instructions. Information such as the one or more layers of the environment, the plurality of 3D points, the one or more layouts, the one or more line segments, the one or more 2D primitives, the one or more 3D primitives, the 2D model of the environment for each layout, the 3D model of the environment, the matching score for the 2D set, the matching score for the 3D set, d, d', $T_d^+$, $T_{d'}^+$, $T^-$, M, the ground plane of the environment, the plurality of images, the visualization image, and/or other suitable information may be communicated from processor module 1604 to memory module 1606 and/or storage module 1610 via bus 1602 for storage. In some aspects, the information may be communicated from processor module 1604, memory module 1606, and/or storage module 1610 to I/O module 1608 via bus 1602. The information may then be communicated from I/O module 1608 to an operator of system 100 and/or system 1100 via the user interface.

One or more processors in a multi-processing arrangement may also be employed to execute the sequences of instructions contained in memory module 1606 and/or storage module 1610. In some aspects, hard-wired circuitry may be used in place of or in combination with software instructions to implement various aspects of the subject disclosure. Thus, aspects of the subject disclosure are not limited to any specific combination of hardware circuitry and software.

The term "machine-readable medium," or "computer-readable medium," as used herein, refers to any medium that participates in providing instructions to processor module 1604 for execution. Such a medium may take many forms, including, but not limited to, non-volatile media and volatile media. Non-volatile media include, for example, optical or magnetic disks, such as storage module 1610. Volatile media include dynamic memory, such as memory module 1606. Common forms of machine-readable media or computer-readable media include, for example, floppy disk, a flexible disk, hard disk, magnetic tape, any other magnetic medium, a CD-ROM, DVD, any other optical medium, punch cards, paper tape, any other physical mediums with patterns of holes, a RAM, a PROM, an EPROM, a FLASH EPROM, any other memory chip or cartridge, or any other medium from which a processor can read.

Methods, systems, and/or machine-readable media for generating a model of an environment are illustrated, for example, according to various aspects described below. These are provided as examples, and do not limit the subject technology.

According to various aspects of the subject technology, a system for generating a model of an environment is provided. The system comprises a layer module configured to identify one or more layers of the environment based on a plurality of three-dimensional (3D) points mapping the environment. The system also comprises a layout module configured to generate a layout for each layer. Each layout comprises a two-dimensional (2D) model of the environment. The system also comprises a construction module configured to generate a 3D model of the environment based on the 2D model of each layout.

In some aspects, each 3D point comprises a laser scanned 3D point. Each 3D point comprises at least one of an elevation coordinate with respect to the environment and a horizontal coordinate with respect to the environment. The layout module is configured to: identify one or more elevations of the environment at which the plurality of 3D points exceeds a predetermined layer threshold; and divide the environment at the identified one or more elevations. An upper boundary of each layer is formed at one of the identified one or more elevations, and a lower boundary of each layer is formed at one of the identified one or more elevations.

In some aspects, each layer comprises corresponding ones of the plurality of 3D points. Each layout comprises a floor plan of a corresponding layer. Each layout is parallel with a ground plane of the environment. In some aspects, the layout module is configured to: project the plurality of 3D points onto corresponding ones of the one or more layouts; generate one or more line segments for each layout based on corresponding ones of the plurality of projected 3D points; generate one or more 2D primitives for each layout based on corresponding ones of the one or more line segments; select a 2D set of the one or more 2D primitives based on corresponding ones of the plurality of 3D points; and generate the 2D model of the environment for each layout based on a corresponding 2D set of the one or more 2D primitives. The plurality of 3D points are projected perpendicularly onto corresponding ones of the one or more layouts. The one or more line segments are generated using a Hough transform.

In some aspects, the layout module is configured to assign the plurality of projected 3D points to a nearest one of the one or more line segments, and to remove at least one of the one or more line segments having less than a predetermined threshold number of projected 3D points assigned to it. The layout module is configured to estimate at least one horizontal axis of each layout, and to align at least one of the one or more line segments with the at least one horizontal axis. At least one 2D primitive is generated based on two corresponding line segments perpendicular to one another and intersecting with one another. At least one 2D primitive is generated based on two corresponding line segments parallel to one another and within a predetermined distance of one another. At least one of the one or more line segments forms at least a partial side of a corresponding 2D primitive. Each 2D primitive comprises at least one of a rectangle, a triangle, and an ellipse.

In some aspects, the layout module is configured to remove at least one 2D primitive having a dimension less than a predetermined threshold. The layout module is configured to remove at least one 2D primitive that is substantially the same as another of the one or more 2D primitives. The layout module is configured to remove at least one 2D primitive having less than a predetermined number of projected 3D points adjacent to its edge within a predetermined distance. Each 2D model comprises a corresponding 2D set of the one or more 2D primitives. Each 2D model comprises a constructive solid geometry (CSG) model. Each 2D model comprises a Boolean combination of two or more 2D primitives of a corresponding 2D set. The 2D set comprises an initial one of the one or more 2D primitives that corresponds to a matching score for the 2D set. The matching score is indicative of a degree of accuracy of the 2D set with respect to representing corresponding ones of the plurality of projected 3D points. The layout module is configured to: determine an addition change in the matching score if a next one of the one or more 2D primitives is added to the 2D set; determine a subtraction change in the matching score if the next one is subtracted from the 2D set; and update the 2D set by adding the next one to the 2D set or subtracting the next one from the 2D set based on the addition change and the subtraction change.

In some aspects, the next one is added to the 2D set or is subtracted from the 2D set based on whether the addition change or the subtraction change increases the matching score by more than a predetermined threshold. The next one is added to the 2D set if the addition change increases the matching score by more than the predetermined threshold. The next one is subtracted from the 2D set if the subtraction change increases the matching score by more than the predetermined threshold. The next one is not added to the 2D set if the addition change does not increase the matching score by more than the predetermined threshold, and the next one is not subtracted from the 2D set if the subtraction change does not increase the matching score by more than the predetermined threshold. The layout module is configured to repeat the determining the addition change, the determining the subtraction change, and the updating the 2D set with subsequent ones of the one or more 2D primitives until the matching score is maximized.

In some aspects, the layout module is configured to determine the matching score for the 2D set. The matching score is given by $w_s s(t) + w_p p(t) + w_r r(t)$, where t is the 2D set of the one or more 2D primitives, $w_s$ provides at least a portion of the matching score, $$s(t) = \frac{\sum_{i \in t} v_i}{\sum_{i | v_i > 0} v_i},$$

v is an emptiness score associated with a pixel of a corresponding layout, the emptiness score being indicative of a count of the number of times a laser associated with corresponding ones of the plurality of projected 3D points intersected with the corresponding pixel, i is an identifier of a corresponding pixel associated with v, $w_p$ provides at least a portion of the matching score, p(t) is a number of the plurality of projected 3D points that are aligned with a perimeter of t divided by a total number of the plurality of projected 3D points of a corresponding layout, $w_r$ provides at least a portion of the matching score, and r(t) is at least a portion of the perimeter of t that is aligned with corresponding ones of the plurality of projected 3D points divided by the perimeter of t.

In some aspects, each pixel is an aggregate of one or more corresponding voxels of a corresponding layer. The layout module is configured to assign a negative value to each $v_i$ having a zero count. For each $v_i$ having a zero count, the layout module is configured to: determine, using a distance transform, a distance from a corresponding pixel to a closest pixel having a positive count; and assign a negative value to the corresponding $v_i$. The assigned negative value is proportional to the distance.

In some aspects, the construction module is configured to: generate a 3D primitive for each 2D primitive of the 2D set of the one or more 2D primitives based on the one or more layers; select a 3D set of the one or more 3D primitives based on the plurality of 3D points; and generate the 3D model of the environment based on the 3D set of the one or more 3D primitives. At least one 3D primitive is generated by extending a corresponding 2D primitive to at least two boundaries of the one or more layers. The construction module is configured to extend each 2D primitive of the 2D set to a boundary of at least one of the one or more layers to generate a corresponding 3D primitive.

In some aspects, the construction module is configured to extend each 2D primitive of the 2D set to a boundary of each of the one or more layers to generate corresponding 3D primitives. Each 3D primitive comprises at least one of a cuboid, a polyhedron, and an ellipsoid. The construction module is configured to remove at least one 3D primitive having a dimension less than a predetermined threshold. The construction module is configured to remove at least one 3D primitive that is substantially the same as another of the one or more 3D primitives. The 3D model comprises the 3D set of the one or more 3D primitives.

In some aspects, the 3D model comprises a constructive solid geometry (CSG) model. The 3D model comprises a Boolean combination of two or more 3D primitives of the 3D set. The 3D set comprises an initial one of the one or more 3D primitives that corresponds to a matching score for the 3D set. The matching score is indicative of a degree of accuracy of the 3D set with respect to representing the plurality of 3D points. The construction module is configured to: determine an addition change in the matching score if a next one of the one or more 3D primitives is added to the 3D set; determine a subtraction change in the matching score if the next one is subtracted from the 3D set; and update the 3D set by adding the next one to the 3D set or subtracting the next one from the 3D set based on the addition change and the subtraction change.

In some aspects, the next one is added to the 3D set or is subtracted from the 3D set based on whether the addition change or the subtraction change increases the matching score by more than a predetermined threshold. The next one is added to the 3D set if the addition change increases the matching score by more than the predetermined threshold, and the next one is subtracted from the 3D set if the subtraction change increases the matching score by more than the predetermined threshold. The next one is not added to the 3D set if the addition change does not increase the matching score by more than the predetermined threshold, and the next one is not subtracted from the 3D set if the subtraction change does not increase the matching score by more than the predetermined threshold. The construction module is configured to repeat the determining the addition change, the determining the subtraction change, and the updating the 3D set with subsequent ones of the one or more 3D primitives until the matching score is maximized.

In some aspects, the construction module is configured to determine the matching score for the 3D set. The matching score is given by $W_S S(T) + W_P P(T) + W_R R(T)$, where T is the 3D set of the one or more 3D primitives, $W_s$ provides at least a portion of the matching score, $$S(T) = \frac{\sum_{I \in T} V_I}{\sum_{I | V_I > 0} V_I},$$

and V is an emptiness score associated with a voxel of the environment. The emptiness score is indicative of a count of the number of times a laser associated with corresponding ones of the plurality of 3D points intersected with the corresponding voxel. I is an identifier of a corresponding voxel associated with V, $W_P$ provides at least a portion of the matching score, P(T) is a number of the plurality of 3D points that are aligned with a surface area boundary of T divided by a total number of the plurality of 3D points, $W_R$ provides at least a portion of the matching score, and R(T) is at least a portion of the surface area boundary of T that is aligned with corresponding ones of the plurality of 3D points divided by the surface area boundary of T.

In some aspects, the construction module is configured to assign a negative value to each $V_I$ having a zero count. For each $V_I$ having a zero count, the construction module is configured to: determine, using a distance transform, a distance from a corresponding voxel to a closest voxel having a positive count; and assign a negative value to the corresponding $V_I$. The assigned negative value is proportional to the distance.

In some aspects, the construction module is configured to align faces of each of the one or more 3D primitives with one another. The construction module is configured to remove at least one of the one or more 3D primitives that has a dimension less than a predetermined threshold and/or does not affect a space of the environment. The 3D model comprises a constructive solid geometry (CSG) model, and the construction module is configured to convert the CSG model into a mesh model. The construction module is configured to convert the CSG model into the mesh model using a computational geometry algorithms library (CGAL).

According to various aspects of the subject technology, a computer-implemented method for generating a model of an environment is provided. The method comprises identifying one or more layers of the environment based on a plurality of three-dimensional (3D) points mapping the environment and generating a layout for each layer. Each layout comprises a two-dimensional (2D) model of the environment. The method also comprises generating a 3D model of the environment based on the 2D model of each layout.

In some aspects, identifying the one or more layers comprises: identifying one or more elevations of the environment at which the plurality of 3D points exceeds a predetermined layer threshold; and dividing the environment at the identified one or more elevations. An upper boundary of each layer is formed at one of the identified one or more elevations. A lower boundary of each layer is formed at one of the identified one or more elevations.

In some aspects, the method further comprises: projecting the plurality of 3D points onto corresponding ones of the one or more layouts; generating one or more line segments for each layout based on corresponding ones of the plurality of projected 3D points; generating one or more 2D primitives for each layout based on corresponding ones of the one or more line segments; selecting a 2D set of the one or more 2D primitives based on corresponding ones of the plurality of 3D points; and generating the 2D model of the environment for each layout based on a corresponding 2D set of the one or more 2D primitives.

In some aspects, the 2D set comprises an initial one of the one or more 2D primitives that corresponds to a matching score for the 2D set. The matching score is indicative of a degree of accuracy of the 2D set with respect to representing corresponding ones of the plurality of projected 3D points. Selecting the 2D set comprises: determining an addition change in the matching score if a next one of the one or more 2D primitives is added to the 2D set; determining a subtraction change in the matching score if the next one is subtracted from the 2D set; and updating the 2D set by adding the next one to the 2D set or subtracting the next one from the 2D set based on the addition change and the subtraction change.

In some aspects, generating the 3D model comprises: generating a 3D primitive for each 2D primitive of the 2D set of the one or more 2D primitives based on the one or more layers; selecting a 3D set of the one or more 3D primitives based on the plurality of 3D points; and generating the 3D model of the environment based on the 3D set of the one or more 3D primitives.

In some aspects, the 3D set comprises an initial one of the one or more 3D primitives that corresponds to a matching score for the 3D set. The matching score is indicative of a degree of accuracy of the 3D set with respect to representing the plurality of 3D points. Selecting the 3D set comprises: determining an addition change in the matching score if a next one of the one or more 3D primitives is added to the 3D set; determining a subtraction change in the matching score if the next one is subtracted from the 3D set; and updating the 3D set by adding the next one to the 3D set or subtracting the next one from the 3D set based on the addition change and the subtraction change.

According to various aspects of the subject technology, a machine-readable medium encoded with executable instructions for generating a model of an environment is provided. The instructions comprise code for: identifying one or more layers of the environment based on a plurality of three-dimensional (3D) points mapping the environment; generating a layout for each layer; projecting the plurality of 3D points onto corresponding ones of the one or more layouts; generating one or more line segments for each layout based on corresponding ones of the plurality of projected 3D points; generating one or more 2D primitives for each layout based on corresponding ones of the one or more line segments; selecting a 2D set of the one or more 2D primitives based on corresponding ones of the plurality of 3D points; generating a two-dimensional (2D) model of the environment for each layout based on a corresponding 2D set of the one or more 2D primitives; and generating a 3D model of the environment based on the 2D model of each layout.

In some aspects, generating the 3D model comprises: generating a 3D primitive for each 2D primitive of the 2D set of the one or more 2D primitives based on the one or more layers; selecting a 3D set of the one or more 3D primitives based on the plurality of 3D points; and generating the 3D model of the environment based on the 3D set of the one or more 3D primitives.

In some aspects, the 2D set comprises an initial one of the one or more 2D primitives that corresponds to a matching score for the 2D set. The matching score is indicative of a degree of accuracy of the 2D set with respect to representing corresponding ones of the plurality of projected 3D points. Selecting the 2D set comprises: determining an addition change in the matching score if a next one of the one or more 2D primitives is added to the 2D set; determining a subtraction change in the matching score if the next one is subtracted from the 2D set; and updating the 2D set by adding the next one to the 2D set or subtracting the next one from the 2D set based on the addition change and the subtraction change.

In some aspects, the instructions further comprise code for determining the matching score for the first set. The matching score is given by $w_s s(t) + w_p p(t) + w_r r(t)$, where t is the 2D set of the one or more 2D primitives, w provides at least a portion of the matching score, $$s(t) = \frac{\sum_{i \in t} v_i}{\sum_{i | v_i > 0} v_i},$$

and v is an emptiness score associated with a pixel of a corresponding layout. The emptiness score is indicative of a count of the number of times a laser associated with corresponding ones of the plurality of projected 3D points intersected with the corresponding pixel. i is an identifier of a corresponding pixel associated with v, $w_p$ provides at least a portion of the matching score, p(t) is a number of the plurality of projected 3D points that are aligned with a perimeter of t divided by a total number of the plurality of projected 3D points of a corresponding layout, $w_r$ provides at least a portion of the matching score, and r(t) is at least a portion of the perimeter of t that is aligned with corresponding ones of the plurality of projected 3D points divided by the perimeter of t.

Methods, systems, and/or machine-readable media for preparing a model of an environment for display are illustrated, for example, according to various aspects described below. These are provided as examples, and do not limit the subject technology.

According to various aspects of the subject technology, a system for preparing a model of an environment for display is provided. The system comprises a transformation module configured to modify a three-dimensional (3D) model of an environment such that a target wall portion of the 3D model is more visible from a viewing direction after the modification than prior to the modification. The modification of the 3D model is based on constructive solid geometry (CSG) and comprises at least one of i) a removal of at least one ceiling wall portion of the 3D model, ii) a thickening of at least one lateral wall portion of the 3D model, and iii) a removal of an obstructing wall portion. The at least one lateral wall portion comprises the obstructing wall portion. The obstructing wall portion blocks at least a partial view of the target wall portion from the viewing direction.

In some aspects, the at least one ceiling wall portion is perpendicular to the at least one lateral wall portion. The obstructing wall portion is parallel to the target wall portion. The obstructing wall portion is opposite the target wall portion. The at least one lateral wall portion comprises at least one of the target wall portion and the obstructing wall portion. In some aspects, the 3D model comprises a CSG model. The 3D model comprises a 3D set of one or more 3D primitives. The 3D model comprises a Boolean combination of two or more 3D primitives of the 3D set.

In some aspects, the transformation module is configured to expand the 3D model along a horizontal vector component of the viewing direction and/or a vertical vector component of the viewing direction. The transformation module is configured to expand the at least one lateral wall portion in a horizontal direction parallel to a ground plane of the environment. The transformation module is configured to expand at least one floor wall portion of the 3D model in a vertical direction perpendicular to a ground plane of the environment.

In some aspects, an original version of the 3D model comprises the 3D model prior to the modification, and the transformation module is configured to subtract the original version of the 3D model from the expanded 3D model to generate a first intermediate version of the 3D model. A reverse direction is diametrically opposed to the viewing direction about a vertical axis perpendicular to a ground plane of the environment, and the transformation module is configured to expand the original version of the 3D model along a horizontal vector component of the reverse direction and/or a vertical vector component of the reverse direction. The transformation module is configured to subtract the original version of the 3D model from the 3D model expanded along the horizontal vector component of the reverse direction and/or the vertical vector component of the reverse direction to generate a second intermediate version of the 3D model. The modified 3D model comprises the first intermediate version of the 3D model added to the second intermediate version of the 3D model.

In some aspects, the modified 3D model is given by $(T_d^+ - T) + (T_{d'}^+ - T)$, where T is the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, and $T_{d'}^+$ is the 3D model expanded along a horizontal vector component of the reverse direction and/or a vertical vector component of the reverse direction.

In some aspects, the transformation module is configured to modify the second intermediate version of the 3D model by subtracting a removal primitive from the second intermediate version of the 3D model such that the obstructing wall portion is removed. The removal primitive comprises at least one of a cuboid, a polyhedron, and an ellipsoid. The removal primitive is positioned at a predetermined distance above a ground plane of the environment. A height of the removal primitive is substantially greater than a height of the 3D model.

In some aspects, the modified 3D model is given by $(T_d^+ - T) + (T_{d'}^+ - T - M)$, where T is the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, $T_{d'}^+$ is the 3D model expanded along a horizontal vector component of the reverse direction and/or a vertical vector component of the reverse direction, and M is a removal primitive for removing the obstructing wall portion.

In some aspects, the transformation module is configured to expand the 3D model to a height substantially greater than a height of the 3D model. The transformation module is configured to subtract the 3D model expanded to the height substantially greater than the height of the 3D model from the 3D model expanded along the horizontal vector component of the viewing direction and/or the vertical vector component of the viewing direction to generate a first intermediate version of the 3D model. A reverse direction is diametrically opposed to the viewing direction about a vertical axis perpendicular to a ground plane of the environment, and the transformation module is configured to expand the 3D model along a horizontal vector component of the reverse direction and/or a vertical vector component of the reverse direction. The transformation module is configured to subtract the 3D model expanded to the height substantially greater than the height of the 3D model from the 3D model expanded along the horizontal vector component of the reverse direction and/or the vertical vector component of the reverse direction to generate a second intermediate version of the 3D model.

In some aspects, the modified 3D model comprises the first intermediate version of the 3D model added to the second intermediate version of the 3D model. The modified 3D model is given by $(T_d^+ - T^-) + (T_{d'}^+ - T^- - M)$, where T is the 3D model, $T^-$ is the 3D model expanded to a height substantially greater than a height of the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, $T_{d'}^+$, is the 3D model expanded along a horizontal vector component of the reverse direction and/or a vertical vector component of the reverse direction, and M is a removal primitive for removing the obstructing wall portion.

In some aspects, the system further comprises a texture module configured to select one or more images from a plurality of images of the environment. The texture module is further configured to map the selected one or more images to the modified 3D model. The texture module is configured to select the one or more images and map the selected one or more images using an image-stitching technique. The texture module is configured to select the one or more images using a Markov Random Field technique. The texture module is configured to group one or more surfaces of the 3D model. The grouped one or more surfaces are substantially coplanar with one another. The selected one or more images are selected from a set of the plurality of images that correspond to the grouped one or more surfaces. The texture module is configured to map the selected one or more images to the grouped one or more surfaces.

In some aspects, the texture module is configured to map the selected one or more images to at least one of a) the at least one ceiling wall portion and b) the at least one lateral wall portion. The texture module is configured to identify at least one floor wall portion of the 3D model. The texture module is configured to map a predetermined texture to the identified at least one floor wall portion. The predetermined texture comprises a solid color.

In some aspects, the texture module is configured to identify one or more wall portions that are substantially coplanar with a ground plane of the environment and are within a predetermined distance of the ground plane. The at least one floor wall portion comprises the identified one or more wall portions.

In some aspects, the system further comprises a visualization module configured to generate a visualization image of the modified 3D model mapped with the one or more selected images from the viewing direction. The viewing direction comprises at least one of a North direction, a South direction, a West direction, and an East direction. The visualization image comprises an oblique image. The oblique image comprises an aerial-like image of the modified 3D model mapped with the one or more selected images taken from about a 45-degree angle from a normal to a ground plane of the environment. The visualization module is configured to package the visualization image with a map tile associated with the environment, and to transmit the map tile and the visualization image to an electronic device in response to a request for the map tile. The electronic device comprises at least one of a laptop computer, a desktop computer, a netbook, a mobile phone, and a tablet.

According to various aspects of the subject technology, a computer-implemented method for preparing a model of an environment for display is provided. The method comprises modifying a three-dimensional (3D) model of an environment such that a target wall portion of the 3D model is more visible from a viewing direction after the modification than prior to the modification. The modification of the 3D model is based on constructive solid geometry (CSG) and comprises at least one of i) a removal of at least one ceiling wall portion of the 3D model, ii) a thickening of at least one lateral wall portion of the 3D model, and iii) a removal of an obstructing wall portion. The at least one lateral wall portion comprises the obstructing wall portion. The obstructing wall portion blocks at least a partial view of the target wall portion from the viewing direction.

In some aspects, the modified 3D model is given by $(T_d^+-T)+(T_{d'}^+-T)$, where T is the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, and $T_{d'}^+$ is the 3D model expanded along a horizontal vector component of the reverse direction and/or a vertical vector component of the reverse direction.

In some aspects, the modified 3D model is given by $(T_d^+-T)+(T_{d'}^+-T-M)$, where T is the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, $T_{d'}^+$ is the 3D model expanded along a horizontal vector component of the reverse direction and/or a vertical vector component of the reverse direction, and M is a removal primitive for removing the obstructing wall portion.

In some aspects, the modified 3D model is given by $(T_d^+-T^-)+(T_{d'}^+-T^--M)$, where T is the 3D model, $T^-$ is the 3D model expanded to a height substantially greater than a height of the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, $T_{d'}^+$ is the 3D model expanded along a horizontal vector component of the reverse direction and/or a vertical vector component of the reverse direction, and M is a removal primitive for removing the obstructing wall portion.

In some aspects, the method further comprises selecting one or more images from a plurality of images of the environment and mapping the selected one or more images to the modified 3D model. In some aspects, the method further comprises generating a visualization image of the modified 3D model mapped with the one or more selected images from the viewing direction.

According to various aspects of the subject technology, a machine-readable medium encoded with executable instructions for preparing a model of an environment for display is provided. The instructions comprise code for modifying a three-dimensional (3D) model of an environment such that a target wall portion of the 3D model is more visible from a viewing direction after the modification than prior to the modification. The modification of the 3D model is based on constructive solid geometry (CSG) and comprises at least one of i) a removal of at least one ceiling wall portion of the 3D model, ii) a thickening of at least one lateral wall portion of the 3D model, and iii) a removal of an obstructing wall portion. The at least one lateral wall portion comprises the obstructing wall portion. The obstructing wall portion blocks at least a partial view of the target wall portion from the viewing direction.

In some aspects, the modified 3D model is given by $(T_d^+-T)+(T_{d'}^+-T)$, where T is the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, and $T_{d'}^+$, is the 3D model expanded along a horizontal vector component of the reverse direction and/or a vertical vector component of the reverse direction.

In some aspects, the modified 3D model is given by $(T_d^+-T)+(T_{d'}^+-T)$, where T is the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, $T_{d'}^+$ is the 3D model expanded along a horizontal vector component of the reverse direction and/or a vertical vector component of the reverse direction, and M is a removal primitive for removing the obstructing wall portion.

In some aspects, the modified 3D model is given by $(T_d^+-T)+(T_{d'}^+-T)$, where T is the 3D model, $T^-$ is the 3D model expanded to a height substantially greater than a height of the 3D model, d is the viewing direction, d' is a reverse direction that is diametrically opposed to the viewing direction about a vertical axis perpendicular to a ground plane of the environment, $T_d^+$ is the 3D model expanded along a horizontal vector component of the viewing direction and/or a vertical vector component of the viewing direction, $T_{d'}^+$, is the 3D model expanded along a horizontal vector component of the reverse direction and/or a vertical vector component of the reverse direction, and M is a removal primitive for removing the obstructing wall portion.

In some aspects, the instructions further comprise code for selecting one or more images from a plurality of images of the environment and mapping the selected one or more images to the modified 3D model. In some aspects, the instructions further comprise code for generating a visualization image of the modified 3D model mapped with the one or more selected images from the viewing direction.

According to various aspects of the subject technology, a processor comprising one or more modules configured to perform the method or function described in any of the foregoing examples is provided. In some aspects, a machine-readable medium encoded with executable instructions for performing the method or function described in any one of the foregoing examples is provided. In some aspects, an apparatus comprising components operable to perform the method or function described in any one of the foregoing examples is provided.

In some aspects, any of the foregoing examples may depend from any one of the other examples. In some aspects, any of the examples may be combined with any other examples. In some aspects, the methods and/or modules described above can be represented in drawings.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these configurations will be readily apparent to those skilled in the art, and generic principles defined herein may be applied to other configurations. Thus, many changes and modifications may be made to the subject technology, by one having ordinary skill in the art, without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments.

A reference to an element in the singular is not intended to mean "one and only one" unless specifically stated, but rather "one or more." The term "some" refers to one or more. All structural and functional equivalents to the elements of the various configurations described throughout this disclosure that are known or later come to be known to those of ordinary skill in the art are expressly incorporated herein by reference and intended to be encompassed by the subject technology.

What is claimed is:

1. A system for preparing a model of an environment for display including a modified version of a three-dimensional (3D) model, the system comprising one or more processors configured to:
    modify an original version of the 3D model of the environment in order to generate the modified version of the 3D model such that a target wall portion of the original version of the 3D model is more visible from a viewing direction in the modified version of the 3D model than from the viewing direction in the original version of the 3D model, wherein the modification of the original version of the 3D model is based on constructive solid geometry (CSG) and includes:
        at least one of i) a removal of at least one ceiling wall portion of the 3D model, ii) a thickening of at least one lateral wall portion of the 3D model, and iii) a removal of an obstructing wall portion, wherein the at least one lateral wall portion comprises the obstructing wall portion, and wherein the obstructing wall portion blocks at least a partial view of the target wall portion from the viewing direction;
        expanding the original version of the 3D model along a horizontal vector component of the viewing direction and/or a vertical vector component of the viewing direction, and
        subtracting the original version of the 3D model from the 3D model expanded along a horizontal vector component of the viewing direction and/or a vertical vector component of the viewing direction to generate a first intermediate version of the 3D model, and wherein the modified version of the 3D model is generated based on at least the first intermediate version of the 3D model.

2. The system of claim 1, wherein the modification further includes expanding the at least one lateral wall portion in a horizontal direction parallel to a ground plane of the environment.

3. The system of claim 1, wherein a reverse direction is diametrically opposed to the viewing direction about a vertical axis perpendicular to a ground plane of the environment, and wherein the modification further includes expanding the original version of the 3D model along a horizontal vector component of the reverse direction and/or a vertical vector component of the reverse direction, and wherein the modified version of the 3D model is generated based on the 3D model expanded along the horizontal vector component of the reverse direction and/or the vertical vector component of the reverse direction.

4. The system of claim 3, wherein the modification further includes subtracting the original version of the 3D model from the 3D model expanded along the horizontal vector component of the reverse direction and/or the vertical vector component of the reverse direction to generate a second intermediate version of the 3D model, and wherein the modified version of the 3D model is further based on the second intermediate version of the 3D model.

5. The system of claim 4, wherein generating the modified 3D model includes adding the first intermediate version of the 3D model to the second intermediate version of the 3D model.

6. The system of claim 4, wherein the modification further includes modifying the second intermediate version of the 3D model by subtracting a removal primitive from the second intermediate version of the 3D model such that the obstructing wall portion is removed.

7. The system of claim 6, wherein the removal primitive is positioned at a predetermined distance above a ground plane of the environment.

8. The system of claim 6, wherein a height of the removal primitive is greater than a height of the 3D model.

9. The system of claim 1, wherein the modification is performed according to:

$$(T_d^+ - T) + (T_{d'}^+ - T - M), \text{ where}$$

T is the original version of the 3D model,
d is the viewing direction,
d' is a reverse direction that is diametrically opposed to the viewing direction about a vertical axis perpendicular to a ground plane of the environment,
$T_d^+$ is the 3D model expanded along the horizontal vector component of the viewing direction and/or the vertical vector component of the viewing direction,
$T_{d'}^+$ is the original version of the 3D model expanded along a horizontal vector component of the reverse direction and/or a vertical vector component of the reverse direction,
M is a removal primitive for removing the obstructing wall portion, and
$(T_d^+ - T)$ is the first intermediate version of the 3D model.

10. The system of claim 1, wherein the modification includes expanding the height of the 3D model.

11. The system of claim 1, wherein the one or more processors are further configured to:
select one or more images from a plurality of images of the environment; and
map the selected one or more images to the modified version of the 3D model.

12. The system of claim 11, wherein the one or more processors are further configured to group one or more surfaces of the 3D model, and wherein the grouped one or more surfaces are substantially coplanar with one another.

13. The system of claim 12, wherein the one or more processors are further configured to map the selected one or more images to the grouped one or more surfaces.

14. The system of claim 11, wherein the one or more processors are further configured to identify at least one floor wall portion of the 3D model.

15. The system of claim 14, wherein the one or more processors are configured to map a predetermined texture to the identified at least one floor wall portion.

16. The system of claim 11, wherein the one or more processors are further configured to generate a visualization image of the modified version of the 3D model mapped with the one or more selected images from the viewing direction.

17. The system of claim 16, wherein the visualization image comprises an oblique image.

18. The system of claim 16, wherein the one or more processors are further configured to:
package the visualization image with a map tile associated with the environment, and
send the map tile and the visualization image to an electronic device in response to a request for the map tile.

19. The system of claim 1, wherein the modification is performed according to:

$$(T_d^+ - T) + (T_{d'}^+ - T), \text{ where}$$

T is the original version of the 3D model,
d is the viewing direction,
d' is a reverse direction that is diametrically opposed to the viewing direction about a vertical axis perpendicular to a ground plane of the environment,
$T_d^+$ is the 3D model expanded along the horizontal vector component of the viewing direction and/or the vertical vector component of the viewing direction,
$T_{d'}^+$ is the original version of the 3D model expanded along a horizontal vector component of the reverse direction and/or a vertical vector component of the reverse direction, and
$(T_d^+ - T)$ is the first intermediate version of the 3D model.

20. A system for preparing a model of an environment for display including a modified version of a three-dimensional (3D) model, the system comprising one or more processors configured to:
modify an original version of the 3D model of the environment in order to generate the modified version of the 3D model such that a target wall portion of the original version of the 3D model is more visible from a viewing direction in the modified version of the 3D model than from the viewing direction in the original version of the 3D model, wherein the modification of the original version of the 3D model is based on constructive solid geometry (CSG) and includes:
at least one of i) a removal of at least one ceiling wall portion of the 3D model, ii) a thickening of at least one lateral wall portion of the 3D model, and iii) a removal of an obstructing wall portion, wherein the at least one lateral wall portion comprises the obstructing wall portion, and wherein the obstructing wall portion blocks at least a partial view of the target wall portion from the viewing direction;
expanding the height of the original version of the 3D model to generate a 3D model having an expanded height; and
subtracting the 3D model having the expanded height from the original version of the 3D model expanded along a horizontal vector component of the viewing direction and/or a vertical vector component of the viewing direction to generate a first intermediate version of the 3D model, and wherein the modified version of the 3D model is generated based on at least the first intermediate version of the 3D model.

21. The system of claim 20, wherein a reverse direction is diametrically opposed to the viewing direction about a vertical axis perpendicular to a ground plane of the environment, and the modification further includes expanding the 3D model along a horizontal vector component of the reverse direction and/or a vertical vector component of the reverse direction, and wherein the modified version of the 3D model is generated based on the 3D model expanded along the horizontal vector component of the reverse direction and/or the vertical vector component of the reverse direction.

22. The system of claim 21, wherein the transformation module is configured to subtract the 3D model having the expanded height from the 3D model expanded along the horizontal vector component of the reverse direction and/or the vertical vector component of the reverse direction to generate a second intermediate version of the 3D model.

23. The system of claim 22, wherein generating the modified 3D model includes adding the first intermediate version of the 3D model to the second intermediate version of the 3D model.

24. The system of claim 20, wherein the modification is performed according to:

$$(T_d^+ - T^-) + (T_{d'}^+ - T^- M), \text{ where}$$

T is the original version of the 3D model,
$T^-$ is the 3D model having the expanded height,
d is the viewing direction,
d' is a reverse direction that is diametrically opposed to the viewing direction about a vertical axis perpendicular to a ground plane of the environment,
$T_d^+$ is the 3D model expanded along the horizontal vector component of the viewing direction and/or the vertical vector component of the viewing direction,
$T_{d'}^+$ is the original version of the 3D model expanded along a horizontal vector component of the reverse direction and/or a vertical vector component of the reverse direction,
M is a removal primitive for removing the obstructing wall portion, and
$(T_d^+ - T)$ is the first intermediate version of the 3D model.

25. A computer-implemented method for preparing a model of an environment including a modified version of a three-dimensional (3D) model for display, the method comprising:
modifying, by one or more processors, an original version of the 3D model of the environment in order to generate the modified version of the 3D model such that a target wall portion of the modified version of the 3D model is more visible from a viewing direction than from the viewing direction in the original version of the 3D model, wherein the modification of the 3D model is based on constructive solid geometry (CSG) and includes:
at least one of i) a removal of at least one ceiling wall portion of the 3D model, ii) a thickening of at least one lateral wall portion of the 3D model, and iii) a removal of an obstructing wall portion, wherein the at least one lateral wall portion comprises the obstructing wall portion, and wherein the obstructing wall portion blocks at least a partial view of the target wall portion from the viewing direction;
expanding the original 3D model along a horizontal vector component of the viewing direction and/or a vertical vector component of the viewing direction, and
subtracting the original version of the 3D model from the 3D model expanded along the horizontal vector component of the viewing direction and/or the vertical vector component of the viewing direction to generate a first intermediate version of the 3D model, and wherein the modified version of the 3D model is generated based on at least the first intermediate version of the 3D model.

26. The method of claim 25, wherein the modification is performed according to:

$$(T_d^+ - T) + (T_{d'}^+ - T), \text{ where}$$

T is the original version of the 3D model,
d is the viewing direction,
d' is a reverse direction that is diametrically opposed to the viewing direction about a vertical axis perpendicular to a ground plane of the environment,
$T_d^+$ is the 3D model expanded along the horizontal vector component of the viewing direction and/or the vertical vector component of the viewing direction,
$T_{d'}^+$ the original version of the 3D model expanded along a horizontal vector component of the reverse direction and/or a vertical vector component of the reverse direction, and
$(T_d^+ - T)$ is the first intermediate version of the 3D model.

27. The method of claim 25, further comprising:
selecting, by the one or more processors, one or more images from a plurality of images of the environment; and
mapping, by the one or more processors, the selected one or more images to the modified version of the 3D model.

28. The method of claim 25, wherein the modification is performed according to:

$$(T_d^+ - T) + (T_{d'}^+ - T - M), \text{ where}$$

T is the original version of the 3D model,
d is the viewing direction,
d' is a reverse direction that is diametrically opposed to the viewing direction about a vertical axis perpendicular to a ground plane of the environment,
$T_d^+$ is the 3D model expanded along the horizontal vector component of the viewing direction and/or the vertical vector component of the viewing direction,
$T_{d'}^+$ is the original version of the 3D model expanded along a horizontal vector component of the reverse direction and/or a vertical vector component of the reverse direction,
M is a removal primitive for removing the obstructing wall portion, and
$(T_d^+ - T)$ is the first intermediate version of the 3D model.

29. A non-transitory machine-readable medium encoded with executable instructions, the instructions when executed by one or more processors cause the one or more processors to perform a method for preparing a model of an environment including a modified version of a three-dimensional (3D) model of the environment for display, the method comprising:
modifying an original version of the 3D model of the environment such that a target wall portion of the original version of the 3D model is more visible from a viewing direction in the modified version of the 3D model than from the viewing direction in the original version of the 3D model;
wherein the modification of the 3D model is based on constructive solid geometry (CSG) and includes:
at least one of i) a removal of at least one ceiling wall portion of the 3D model, ii) a thickening of at least one lateral wall portion of the 3D model, and iii) a removal of an obstructing wall portion, wherein the at least one lateral wall portion comprises the obstructing wall portion, and wherein the obstructing wall portion blocks at least a partial view of the target wall portion from the viewing direction, expanding the height of the original version of the 3D model to generate a 3D model having an expanded height; and subtracting the 3D model having the expanded height from the original version of the 3D model expanded along a horizontal vector component of the viewing direction and/or a vertical vector component of the viewing direction to generate a first intermediate version of the 3D model, and wherein the modified version of the 3D model is generated based on at least the first intermediate version of the 3D model;

selecting one or more images from a plurality of images of the environment; and mapping the selected one or more images to the modified 3D model.

30. The machine-readable medium of claim 29, wherein the modification is performed according to:

$$(T_d^+ - T^-) + (T_{d'}^+ - T^- - M), \text{ where}$$

T is the original version 3D model, $T^-$ is the 3D model having the expanded height, d is the viewing direction, d' is a reverse direction that is diametrically opposed to the viewing direction about a vertical axis perpendicular to a ground plane of the environment, $T_d^+$ is the 3D model expanded along the horizontal vector component of the viewing direction and/or the vertical vector component of the viewing direction, $T_{d'}^+$ is the 3D model expanded along a horizontal vector component of the reverse direction and/or a vertical vector component of the reverse direction, M is a removal primitive for removing the obstructing wall portion, and $(T_d^+ - T^-)$ is the first intermediate version of the 3D model.

* * * * *